US008846536B2

(12) United States Patent
Draeger et al.

(10) Patent No.: US 8,846,536 B2
(45) Date of Patent: *Sep. 30, 2014

(54) FLOWABLE OXIDE FILM WITH TUNABLE WET ETCH RATE

(75) Inventors: Nerissa Draeger, Fremont, CA (US); Karena Shannon, San Jose, CA (US); Bart van Schravendijk, Sunnyvale, CA (US); Kaihan Ashtiani, Cupertino, CA (US)

(73) Assignee: Novellus Systems, Inc., Fremont, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 13/493,936

(22) Filed: Jun. 11, 2012

(65) Prior Publication Data
US 2013/0230987 A1 Sep. 5, 2013

Related U.S. Application Data

(60) Provisional application No. 61/606,876, filed on Mar. 5, 2012.

(51) Int. Cl.
*H01L 21/311* (2006.01)
(52) U.S. Cl.
USPC .............. 438/694; 216/87; 216/99; 438/705; 438/756; 438/757; 438/760; 438/787; 438/788; 438/791; 438/792
(58) Field of Classification Search
CPC . H01L 21/31; H01L 21/302; H01L 21/02126; H01L 21/02318; H01L 21/3105; H01L 21/30604; H01L 21/461; C03C 15/00; C23C 16/56
See application file for complete search history.

(56) References Cited

U.S. PATENT DOCUMENTS

| 4,099,990 | A | 7/1978 | Brown et al. |
| 4,740,480 | A | 4/1988 | Ooka |
| 4,923,720 | A | 5/1990 | Lee et al. |
| 5,281,274 | A | 1/1994 | Yoder |
| 5,320,983 | A | 6/1994 | Ouellet |

(Continued)

FOREIGN PATENT DOCUMENTS

| EP | 1 063 692 A1 | 12/2000 |
| JP | 2001-148382 | 5/2001 |

(Continued)

OTHER PUBLICATIONS

U.S. Office Action mailed Aug. 23, 2005, from U.S. Appl. No. 10/810,066.

(Continued)

*Primary Examiner* — Lan Vinh
*Assistant Examiner* — Jiong-Ping Lu
(74) *Attorney, Agent, or Firm* — Weaver Austin Villeneuve & Sampson LLP

(57) ABSTRACT

Provided herein are integration-compatible dielectric films and methods of depositing and modifying them. According to various embodiments, the methods can include deposition of flowable dielectric films targeting specific film properties and/or modification of those properties with an integration-compatible treatment process. In certain embodiments, methods of depositing and modifying flowable dielectric films having tunable wet etch rates and other properties are provided. Wet etch rates can be tuned during integration through am integration-compatible treatment process. Examples of treatment processes include plasma exposure and ultraviolet radiation exposure.

22 Claims, 19 Drawing Sheets

(56) References Cited

U.S. PATENT DOCUMENTS

| | | |
|---|---|---|
| 5,387,546 A | 2/1995 | Maeda et al. |
| 5,516,721 A | 5/1996 | Galli et al. |
| 5,525,157 A | 6/1996 | Hawkins et al. |
| 5,534,731 A | 7/1996 | Cheung |
| 5,747,381 A | 5/1998 | Wu et al. |
| 5,807,785 A | 9/1998 | Ravi |
| 5,840,631 A | 11/1998 | Kubo et al. |
| 5,858,880 A | 1/1999 | Dobson et al. |
| 5,874,367 A | 2/1999 | Dobson |
| 5,899,751 A | 5/1999 | Chang et al. |
| 5,902,127 A | 5/1999 | Park |
| 5,932,289 A | 8/1999 | Dobson et al. |
| 5,990,013 A | 11/1999 | Berenguer et al. |
| 6,013,581 A | 1/2000 | Wu et al. |
| 6,054,379 A | 4/2000 | Yau et al. |
| 6,060,384 A | 5/2000 | Chen et al. |
| 6,072,227 A | 6/2000 | Yau et al. |
| 6,114,224 A | 9/2000 | Ngo et al. |
| 6,114,259 A | 9/2000 | Sukharev et al. |
| 6,143,626 A | 11/2000 | Yabu et al. |
| 6,207,535 B1 | 3/2001 | Lee et al. |
| 6,218,268 B1 | 4/2001 | Xia et al. |
| 6,242,366 B1 | 6/2001 | Beekman et al. |
| 6,287,989 B1 | 9/2001 | Dobson |
| 6,300,219 B1 | 10/2001 | Doan et al. |
| 6,309,933 B1 | 10/2001 | Li et al. |
| 6,323,123 B1 | 11/2001 | Liu et al. |
| 6,383,951 B1 | 5/2002 | Li |
| 6,399,213 B2 | 6/2002 | Shiokawa |
| 6,413,583 B1 | 7/2002 | Moghadam et al. |
| 6,448,187 B2 | 9/2002 | Yau et al. |
| 6,475,564 B1 | 11/2002 | Carter et al. |
| 6,544,858 B1 | 4/2003 | Beekman et al. |
| 6,635,586 B2 | 10/2003 | Goo et al. |
| 6,640,840 B1 | 11/2003 | MacNeil |
| 6,653,247 B2 | 11/2003 | MacNeil |
| 6,660,663 B1 | 12/2003 | Cheung et al. |
| 6,743,436 B1 | 6/2004 | Lee |
| 6,743,736 B2 | 6/2004 | Mardian et al. |
| 6,787,463 B2 | 9/2004 | Mardian et al. |
| 6,790,737 B2 | 9/2004 | Schneegans et al. |
| 6,812,135 B2 | 11/2004 | Li et al. |
| 6,828,162 B1 | 12/2004 | Halliyal et al. |
| 6,846,757 B2 | 1/2005 | MacNeil |
| 6,858,195 B2 | 2/2005 | Aronowitz et al. |
| 6,902,947 B2 | 6/2005 | Chinn et al. |
| 6,972,262 B2 | 12/2005 | Lee et al. |
| 6,984,561 B2 | 1/2006 | Herner et al. |
| 6,995,056 B2 | 2/2006 | Lee et al. |
| 7,033,945 B2 | 4/2006 | Byun et al. |
| 7,056,560 B2 | 6/2006 | Yim et al. |
| 7,071,126 B2 | 7/2006 | Johnston et al. |
| 7,074,690 B1 | 7/2006 | Gauri et al. |
| 7,074,727 B2 | 7/2006 | Hsu et al. |
| 7,153,783 B2 | 12/2006 | Lu et al. |
| 7,211,525 B1 | 5/2007 | Shanker et al. |
| 7,238,604 B2 | 7/2007 | Kloster et al. |
| 7,365,000 B2 | 4/2008 | Lee et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,575,633 B2 | 8/2009 | Romanin |
| 7,582,555 B1 | 9/2009 | Lang et al. |
| 7,585,704 B2 | 9/2009 | Belyansky et al. |
| 7,589,012 B1 | 9/2009 | Seo et al. |
| 7,622,369 B1 | 11/2009 | Lee et al. |
| 7,629,227 B1 | 12/2009 | Wang et al. |
| 7,655,532 B1 | 2/2010 | Chen et al. |
| 7,727,906 B1 | 6/2010 | Shanker et al. |
| 7,804,130 B1 | 9/2010 | Fung |
| 7,825,044 B2 | 11/2010 | Mallick et al. |
| 7,888,233 B1 | 2/2011 | Gauri et al. |
| 7,888,273 B1 | 2/2011 | Wang et al. |
| 7,915,139 B1 | 3/2011 | Lang et al. |
| 8,187,951 B1 | 5/2012 | Wang et al. |
| 8,278,224 B1 | 10/2012 | Mui et al. |
| 8,481,403 B1 | 7/2013 | Gauri et al. |
| 8,557,712 B1 | 10/2013 | Antonelli et al. |
| 8,580,697 B1 | 11/2013 | Lang et al. |
| 2002/0006729 A1 | 1/2002 | Geiger et al. |
| 2003/0066482 A1 | 4/2003 | Pokharna et al. |
| 2003/0077887 A1 | 4/2003 | Jang et al. |
| 2003/0146416 A1 | 8/2003 | Takei et al. |
| 2003/0159655 A1 | 8/2003 | Lin et al. |
| 2003/0194861 A1 | 10/2003 | Mardian et al. |
| 2003/0210065 A1 | 11/2003 | Lu et al. |
| 2004/0048455 A1 | 3/2004 | Karasawa et al. |
| 2004/0152342 A1 | 8/2004 | Li et al. |
| 2004/0169005 A1 | 9/2004 | Kim et al. |
| 2004/0224496 A1 | 11/2004 | Cui et al. |
| 2005/0026443 A1 | 2/2005 | Goo et al. |
| 2005/0112282 A1 | 5/2005 | Gordon |
| 2005/0136684 A1 | 6/2005 | Mukai et al. |
| 2005/0150453 A1 | 7/2005 | Simmons et al. |
| 2005/0181566 A1 | 8/2005 | Machida et al. |
| 2005/0212179 A1 | 9/2005 | Honda et al. |
| 2005/0260864 A1 | 11/2005 | Huang et al. |
| 2006/0014384 A1 | 1/2006 | Lee et al. |
| 2006/0024912 A1 | 2/2006 | Lee |
| 2006/0216946 A1 | 9/2006 | Usami et al. |
| 2006/0223290 A1 | 10/2006 | Belyansky et al. |
| 2006/0269693 A1 | 11/2006 | Balseanu et al. |
| 2006/0270217 A1 | 11/2006 | Balseanu et al. |
| 2007/0054505 A1 | 3/2007 | Antonelli et al. |
| 2007/0281495 A1* | 12/2007 | Mallick et al. ............... 438/778 |
| 2007/0298585 A1 | 12/2007 | Lubomirsky et al. |
| 2008/0020591 A1 | 1/2008 | Balseanu et al. |
| 2008/0081434 A1 | 4/2008 | Nam et al. |
| 2008/0132087 A1* | 6/2008 | Xia et al. ............... 438/789 |
| 2009/0020847 A1 | 1/2009 | Byun et al. |
| 2009/0053895 A1 | 2/2009 | Oshima et al. |
| 2009/0061647 A1* | 3/2009 | Mallick et al. ............... 438/773 |
| 2009/0104789 A1 | 4/2009 | Mallick et al. |
| 2009/0104790 A1 | 4/2009 | Liang |
| 2009/0298257 A1 | 12/2009 | Lee et al. |
| 2009/0321936 A1 | 12/2009 | Kojima et al. |
| 2010/0109155 A1 | 5/2010 | Liu et al. |
| 2010/0167533 A1 | 7/2010 | Lim et al. |
| 2011/0081782 A1* | 4/2011 | Liang et al. ............... 438/697 |
| 2011/0151678 A1* | 6/2011 | Ashtiani et al. ............... 438/786 |
| 2012/0149213 A1 | 6/2012 | Nittala et al. |
| 2012/0161405 A1 | 6/2012 | Mohn et al. |
| 2012/0164328 A1 | 6/2012 | Kojima et al. |
| 2013/0122718 A1 | 5/2013 | Kato et al. |

FOREIGN PATENT DOCUMENTS

| | | |
|---|---|---|
| JP | 2010-153859 | 7/2010 |
| WO | WO 2007/140376 | 12/2007 |
| WO | WO 2007/140424 | 12/2007 |
| WO | WO 2011/072143 | 6/2011 |

OTHER PUBLICATIONS

Lang et al., "CVD Flowable Gap Fill," Novellus Systems, Inc., U.S. Appl. No. 11/323,812, filed Dec. 29, 2005, pp. 1-21.

Notice of Allowance and Fee Due mailed Feb. 15, 2006 from U.S. Appl. No. 10/810,066.

Allowed Claims from U.S. Appl. No. 10/810,066.

Gauri et al., "Flowable Film Dielectric Gap Fill Process," Novellus Systems, Inc., U.S. Appl. No. 11/447,594, filed Jun. 5, 2006.

U.S. Office Action mailed Jun. 27, 2008, from U.S. Appl. No. 11/447,594.

U.S. Office Action mailed Oct. 26, 2007, from U.S. Appl. No. 11/323,812.

U.S. Office Action mailed Apr. 9, 2008, from U.S. Appl. No. 11/323,812.

U.S. Office Action mailed Oct. 9, 2008, from U.S. Appl. No. 11/323,812.

Wang, et al., "CVD Flowable Gap Fill," Novellus Systems, Inc., U.S. Appl. No. 11/925,514, filed Oct. 26, 2007.

Wang, et al., "Density Gradient-Free Gap Fill," Novellus Systems, Inc., U.S. Appl. No. 11/834,581, filed Aug. 6, 2007.

(56) References Cited

OTHER PUBLICATIONS

Notice of Allowance and Fee Due mailed Dec. 11, 2008, from U.S. Appl. No. 11/447,594.
Allowed Claims from U.S. Appl. No. 11/447,594.
U.S. Office Action mailed Nov. 4, 2008, from U.S. Appl. No. 11/925,514.
U.S. Office Action mailed Nov. 12, 2008, from U.S. Appl. No. 11/834,581.
Antonelli et al., "PECVD Flowable Dielectric Gap Fill," Novellus Systems, Inc., U.S. Appl. No. 12/334,726, filed Dec. 15, 2008.
Gauri et al., "Flowable Film Dielectric Gap Fill Process," Novellus Systems, Inc., U.S. Appl. No. 12/411,243, filed Mar. 25, 2009.
Notice of Allowance and Fee Due mailed Apr. 23, 2009 from U.S. Appl. No. 11/323,812.
Allowed Claims from U.S. Appl. No. 11/323,812.
U.S. Final Office Action mailed Jun. 17, 2009, from U.S. Appl. No. 11/925,514.
Notice of Allowance and Fee Due mailed Jul. 29, 2009 from U.S. Appl. No. 11/925,514.
Allowed Claims from U.S. Appl. No. 11/925,514.
Mui et al., "Flowable Oxide Deposition Using Rapid Delivery of Process Gases," Novellus Systems, Inc., U.S. Appl. No. 12/566,085, filed Sep. 24, 2009.
Lang et al., "CVD Flowable Gap Fill", Novellus Systems, Inc., U.S. Appl. No. 12/508,461, filed Jul. 23, 2009.
Chung, et al., "Flowable Oxide CVD Process for Shallow Trench Isolation in Silicon Semiconductor," Journal of Semiconductor Technology and Science, vol. 4, No. 1, Mar. 2004, pp. 45-51.
U.S. Final Office Action mailed Aug. 6, 2009, from U.S. Appl. No. 11/834,581.
U.S. Office Action mailed Dec. 18, 2009, from U.S. Appl. No. 11/834,581.
Wang et al., "CVD Flowable Gap Fill", Novellus Systems, Inc., U.S. Appl. No. 12/625,468, filed Nov. 24, 2009.
U.S. Office Action mailed Feb. 26, 2010, from U.S. Appl. No. 12/334,726.
U.S. Final Office Action mailed Apr. 22, 2010, for U.S. Appl. No. 11/834,581.
U.S. Office Action mailed May 24, 2010, for U.S. Appl. No. 12/411,243.
U.S. Final Office Action mailed Sep. 13, 2010 for U.S. Appl. No. 12/411,243.
U.S. Final Office Action mailed Oct. 26, 2010 for U.S. Appl. No. 12/334,726.
Notice of Allowance mailed Oct. 6, 2010 for U.S. Appl. No. 12/411,243.
Allowed Claims for U.S. Appl. No. 12/411,243.
Notice of Allowance mailed Nov. 18, 2010 for U.S. Appl. No. 12/508,461.
Allowed Claims for U.S. Appl. No. 12/508,461.
Notice of Allowance mailed Oct. 7, 2010 for U.S. Appl. No. 11/834,581.
Allowed Claims for U.S. Appl. No. 11/834,581.
Ashtiani et al., "Novel Gap Fill Integration," Novellus Systems, Inc., U.S. Appl. No. 12/964,110, filed Dec. 9, 2010.
Lang et al., "CVD Flowable Gap Fill", Novellus Systems, Inc., U.S. Appl. No. 13/031,077, filed Feb. 18, 2011.
Matsuura, M., et al., "Novel Self-Planarizing CVD Oxide for Interlayer Dielectric Applications," IEEE, 1994, pp. 117-120.
Hatanaka, M., et al., "$H_2O$-TEOS Plasma-CVD Realizing Dielectrics Having a Smooth Surface," IEEE, VMIC Conference, Jun. 11-12, 1991, pp. 435-441.
Sakaue, H., et al., "Digital Chemical Vapor Deposition of $SiO_2$ Using a Repetitive Reaction of Triethylsilane /Hydrogen and Oxidation," Department of Electrical Engineering, Hiroshima University, published Nov. 17, 1990, pp. L 124-L 127.
Nakano, M., et al., "Digital CVD of $SiO_2$," Extended Abstracts of the $21^{st}$ Conference on Solid State Devices and Materials, Tokyo, 1989, pp. 49-52.

Noguchi, S., et al., "Liquid Phase Oxidation Employing O Atoms Produced by Microwave Discharge and $Si(CH_3)_4$," Extended Abstracts of the $19^{th}$ Conference on Solid State Devices and Materials, Tokyo, 1987, pp. 451-454.
Chung, Sung-Woong, et al., "Novel Shallow Trench Isolation Process Using Flowable Oxide CVD for sub-100nm Dram," IEEE, 2002, IEDM, pp. 233-236.
U.S. Office Action for U.S. Appl. No. 12/625,468 mailed Apr. 26, 2011.
Gauri et al., "Flowable Film Dielectric Gap Fill Process," Novellus Systems, Inc., U.S. Appl. No. 12/984,524, filed Jan. 4, 2011.
International Search Report and Written Opinion mailed Aug. 10, 2011 for Application No. PCT/US2010/059721.
U.S. Office Action for U.S. Appl. No. 12/334,726 mailed Sep. 16, 2011.
U.S. Final Office Action for U.S. Appl. No. 12/625,468 mailed Oct. 14, 2011.
Wang, et al., "Density Gradient-Free Gap Fill," Novellus Systems, Inc., U.S. Appl. No. 12/986,070, filed Jan. 6, 2011.
U.S. Office Action for U.S. Appl. No. 12/986,070 mailed Nov. 25, 2011.
Danek, et al., "Premetal Dielectric Integration Process," Novellus Systems, Inc., U.S. Appl. No. 13/315,123, filed Dec. 8, 2011.
Nittala, et al., "Bottom Up Fill in High Aspect Ratio Trenches," Novellus Systems, Inc., U.S. Appl. No. 13/313,735, filed Dec. 7, 2011.
Notice of Allowance for U.S. Appl. No. 12/625,468 mailed Jan. 31, 2012.
Allowed claims for U.S. Appl. No. 12/625,468 as of Jan. 31, 2012.
U.S. Final Office Action for U.S. Appl. No. 12/334,726 mailed Mar. 30, 2012.
U.S. Office Action for U.S. Appl. No. 12/984,524 mailed May 18, 2012.
Notice of Allowance for U.S. Appl. No. 12/566,085 mailed May 29, 2012.
Allowed claims for U.S. Appl. No. 12/566,085 as of May 29, 2012.
Notice of Allowance for U.S. Appl. No. 13/031,077 mailed Aug. 6, 2012.
U.S. Final Office Action for U.S. Appl. No. 12/986,070 mailed Jun. 25, 2012.
U.S. Appl. No. 13/935,398, filed Jul. 3, 2013, entitled "Flowable Film Dielectric Gap Fill Process".
U.S. Appl. No. 13/461,287, filed May 1, 2012, entitled "CVD Flowable Gap Fill".
U.S. Appl. No. 13/607,511, filed Sep. 7, 2012, entitled "Flowable Oxide Deposition Using Rapid Delivery of Process Gases".
US Final Office Action, dated Sep. 14, 2012, issued in U.S. Appl. No. 12/984,524.
US Notice of Allowance, dated Mar. 7, 2013, issued in U.S. Appl. No. 12/984,524.
US Notice of Allowance, dated Jul. 8, 2013, issued in U.S. Appl. No. 13/031,077.
US Office Action, dated Aug. 15, 2013, issued in U.S. Appl. No. 13/461,287.
US Notice of Allowance dated Jun. 10, 2013, issued in U.S. Appl. No. 12/334,726.
US Notice of Allowance, dated May 29, 2012, issued in U.S. Appl. No. 12/566,085.
US Notice of Allowance, dated Jun. 21, 2012, issued in U.S. Appl. No. 12/566,085.
US Office Action, dated Jun. 21, 2013, issued in U.S. Appl. No. 13/607,511.
US Final Office Action, dated Dec. 11, 2013, issued in U.S. Appl. No. 13/607,511.
US Office Action, dated Dec. 21, 2012, issued in U.S. Appl. No. 12/964,110.
US Final Office Action, dated Sep. 12, 2013, issued in U.S. Appl. No. 12/694,110.
US Office Action, dated Dec. 6, 2012, issued in U.S. Appl. No. 13/315,123.
US Office Action, dated Jul. 15, 2013, issued in U.S. Appl. No. 13/315,123.

(56) References Cited

OTHER PUBLICATIONS

US Notice of Allowance, dated Nov. 8, 2013, issued in U.S. Appl. No. 13/315,123.
US Office Action, dated Nov. 8, 2013, issued in U.S. Appl. No. 13/313,735.
Japanese Office Action dated Sep. 17, 2013 issued in JP2009-282737.
PCT International Preliminary Report on Patentability and Written Opinion dated Jun. 21, 2012 issued in PCT/US2010/059721.
Chung, et al. (Mar. 2004) "Flowable Oxide CVD Process for Shallow Trench Isolation in Silicon Semiconductor," Journal of Semiconductor Technology and Science, 4(1):45-51.
Siber, V. et al. (1994-1995) "Claiming Computer-Related articles of Manufacture," in IDEA: The Journal of Law and Technology, pp. 13-35.

* cited by examiner

O2 Plasma Treatment

Dense SiO created by shrinkage

Low density SiO etched by HF

N2 Plasma Treatment

SiON material with lower wet etch rate in HF

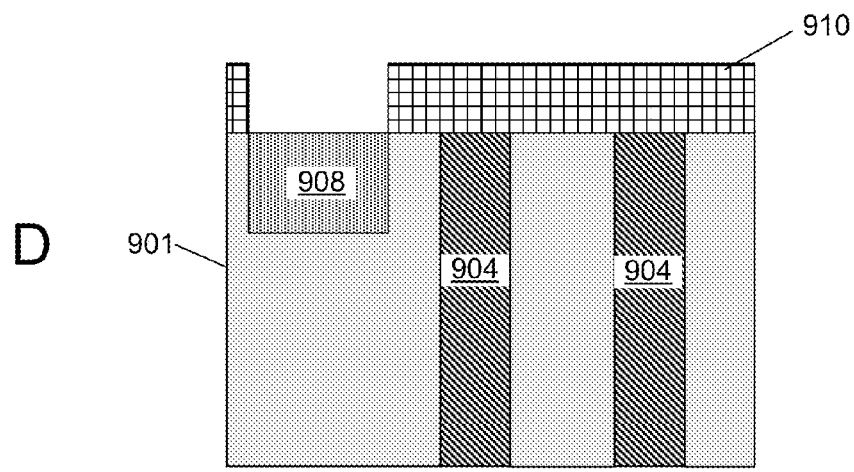
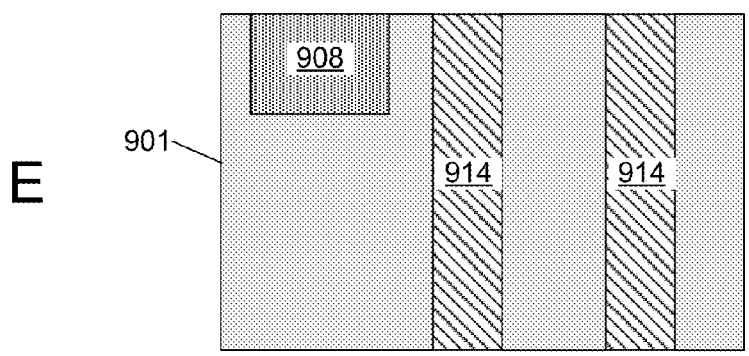
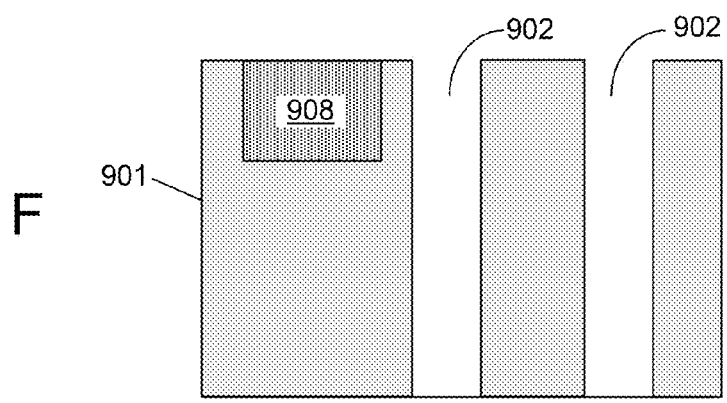
Figure 9, cont.

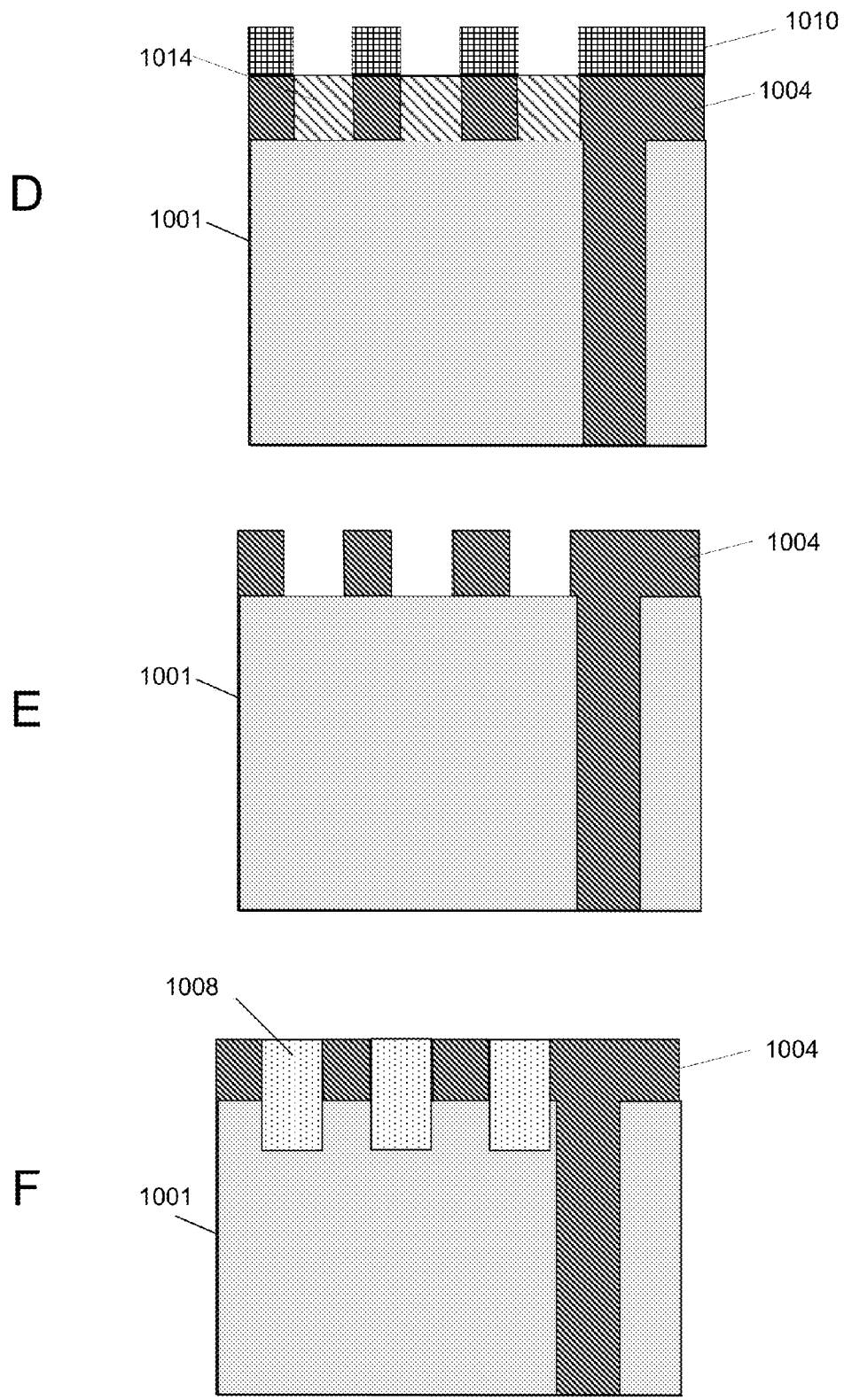
Figure 10A, cont.

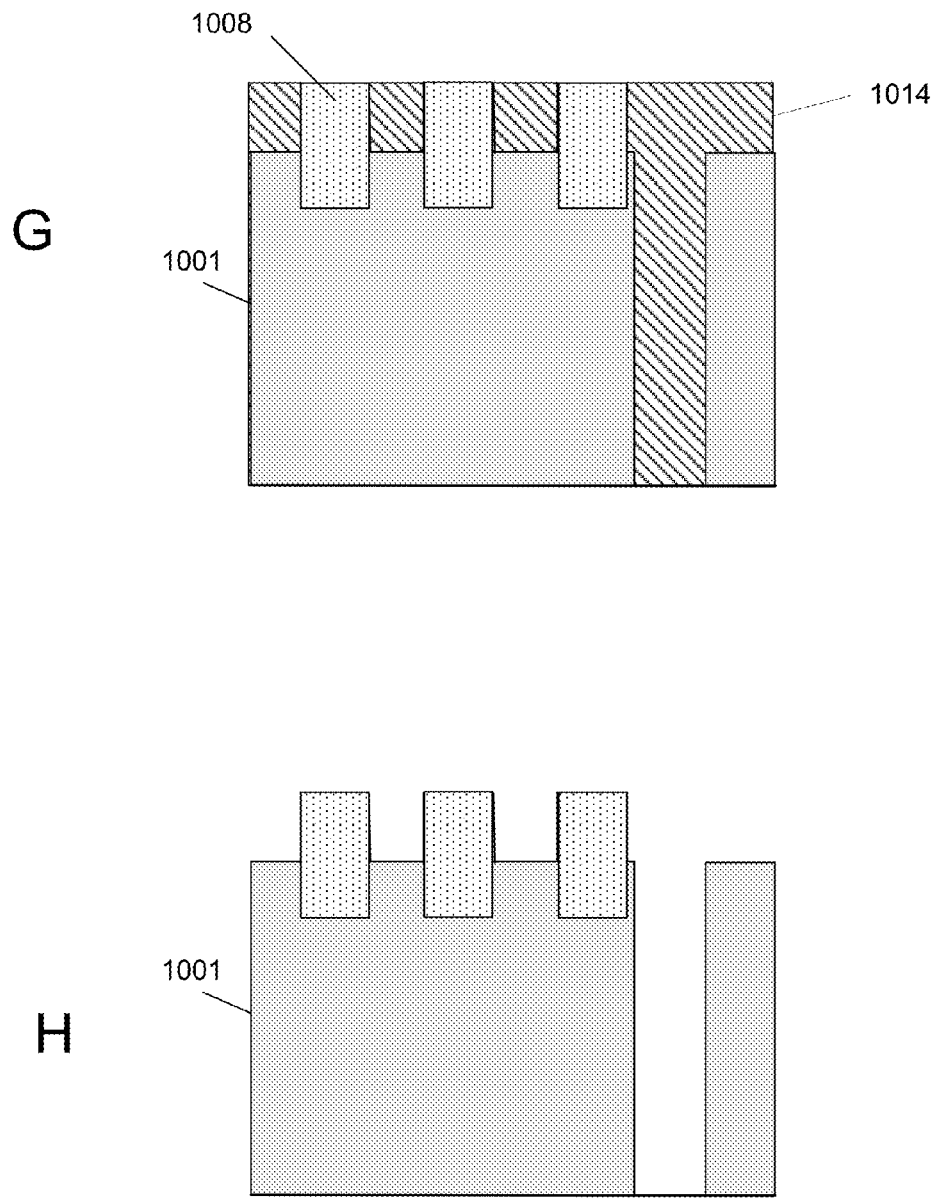
Figure 10A, cont.

FLOWABLE OXIDE FILM WITH TUNABLE WET ETCH RATE

CROSS-REFERENCE TO RELATED APPLICATION

This application is claim benefit under 35 USC §119(e) to U.S. Provisional Patent Application No. 61/606,876, filed Mar. 5, 2012, which is incorporated by reference herein.

BACKGROUND OF THE INVENTION

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

SUMMARY OF THE INVENTION

Provided herein are integration-compatible dielectric films and methods of depositing and modifying them. According to various embodiments, the methods can include deposition of flowable dielectric films targeting specific film properties and/or modification of those properties with an integration-compatible treatment process. In certain embodiments, methods of depositing and modifying flowable dielectric films having tunable wet etch rates and other properties are provided. Wet etch rates can be tuned during integration through am integration-compatible treatment process. Examples of treatment processes include plasma exposure, ultraviolet radiation exposure, thermal anneal, e-beam exposure and microwave exposure.

Aspects of the invention described herein relate to dielectric films that have tunable properties. Properties of dielectric films include dielectric constant, refractive index (RI), wet etch rate (WER), dry etch rate, composition, hardness and modulus, resist strip or ash rate, and chemical mechanical planarization (CMP) removal rate. One aspect relates to flowable oxide and other flowable dielectric films having a tunable wet etch rate (WER). In some embodiments, an as-deposited flowable oxide film has a tunable WER. The WER can be modified at various stages according to the integration process.

Another aspect relates to formation of flowable dielectric films having tunable properties. In some embodiments, formation of flowable dielectric film is performed such that properties including WER and dry etch rate are targeted through precursor selection, dopants and post-deposition processes. In some embodiments, flowable dielectric films having a target carbon concentration are formed. In some embodiments, flowable dielectric films having a target nitrogen concentration are formed. In some embodiments, flowable dielectric films having a target O:Si ratio are formed. In some embodiments, flowable dielectric films having a target hydrogen concentration are formed.

Another aspect relates to tuning the WER of flowable oxide films. According to various embodiments, flowable oxide films can be treated to increase or decrease the WER. In some embodiments, the treatment processes can include exposure to reactive species and/or exposure to electromagnetic radiation. In some embodiments, the treatment processes can be performed after patterning and partial integration These and other aspects of the invention are described more fully below with reference to the drawings.

BRIEF DESCRIPTION OF DRAWINGS

FIG. 8A shows a carbon-containing low-k flowable oxide film decorated in 6:1 buffered oxide etch (BOE), and FIG. 8B after the low flowable oxide film after $O_2$-based based treatment decorated in 6:1 BOE.

DETAILED DESCRIPTION OF THE INVENTION

Introduction

Figure 1:
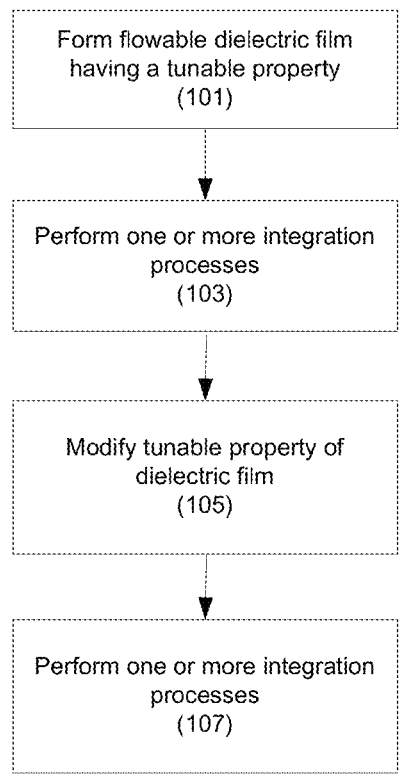
FIG. 1 is flow diagram illustrating certain operations in a method of fabricating a device, display or other article using a dielectric film having a tunable property.

Aspects of the present invention relate to flowable dielectric films, including the deposition and tuning of flowable dielectric films and related integration schemes. Some embodiments include filling high aspect ratio gaps with insulating material. While the description below refers chiefly to flowable silicon oxide films, the integration schemes described herein may also be used with other types of flowable dielectric films. For example, the dielectric film may be primarily silicon nitride, with Si—N and N—H bonds, primarily silicon oxynitride, primarily silicon carbide or primarily silicon oxycarbide Vapor-phase reactants are introduced to a deposition chamber to deposit the flowable dielectric films. As-deposited, the flowable dielectric films generally have flow characteristics that can provide consistent fill of a gap, though according to various embodiments, they can be used to deposit overburden layers, blanket layers, and other non-gap fill processes as well as to fill gaps. The term "as-deposited flowable dielectric film" refers to a flowable dielectric film prior to any post-deposition treatments. An as-deposited flowable dielectric film may be characterized as a soft jelly-like film, a gel having liquid flow characteristics, a liquid film, or a flowable film.

The flowable dielectric deposition methods described herein are not limited to a particular reaction mechanism; the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The term flowable dielectric film can include any dielectric film that is formed from vapor-phase reactants and is flowable as-deposited, including films that have been treated such that they are no longer flowable. In some embodiments, the films may undergo a certain amount of densification during the deposition itself.

The as-deposited films can be treated to physically densify and/or chemically convert the as-deposited film to a desired dielectric material. As used herein, the term "densified flowable dielectric film" refers to a flowable dielectric film that has been physically densified and/or chemically converted to reduce its flowability. In some embodiments, the densified flowable dielectric film may be considered to be solidified. In some embodiments, physically densifying the film can involve shrinking the film; according to various embodiments, a densified flowable dielectric film may or may not be shrunk as compared to the as-deposited dielectric film. In some cases physically densifying the film can involve substituting chemicals in the film, which may result in denser, higher volume films.

An example of a post-deposition treatment is an oxidizing plasma that converts the film to an Si—O network and physically densifies the film. In some embodiments, different operations may be performed for conversion and physical densification. Densification treatments may also be referred to as cures or anneals. A post-deposition treatment may be performed in situ in the deposition module, or ex-situ in another module, or in a combination of both. Further description of post-deposition treatment operations is provided below.

Aspects of the invention described herein relate to dielectric films that have tunable properties. Properties of dielectric films include dielectric constant, refractive index (RI), wet etch rate (WER), dry etch rate, dielectric constant, refractive index (RI), wet etch rate (WER), dry etch rate, composition, hardness and modulus, resist strip or ash rate, and chemical mechanical planarization (CMP) removal rate. A tunable property is a property that can be modified at some point after deposition and subsequent processing. Properties such as WER, dry etch rate and CMP rate can be important during integration. The films and methods described herein allow tuning properties for particular integration schemes.

One aspect relates to flowable oxide and other flowable dielectric films having a tunable wet etch rate (WER). In some embodiments, an as-deposited flowable oxide film has a tunable WER. The WER can be modified at various stages according to the integration process. For example, a low-k flowable oxide film (e.g., a carbon doped silicon oxide) can be deposited with a low WER, which can be increased. In another example, an undoped silicate glass (USG) having a high, but tunable, WER in hydrofluoric (HF) chemistry can be deposited. The WER can be decreased in subsequent processing.

Another aspect relates to formation of flowable dielectric films having tunable properties. In some embodiments, formation of flowable dielectric film is performed such that properties including WER and dry etch rate are targeted through precursor selection, dopants and post-deposition processes. In some embodiments, flowable dielectric films having a target carbon concentration are formed. In some embodiments, flowable dielectric films having a target nitrogen concentration are formed.

Another aspect relates to tuning the WER of flowable oxide films. According to various embodiments, flowable oxide films can be treated to increase or decrease the WER. In some embodiments, the treatment processes can include exposure to reactive species and/or exposure to electromagnetic radiation. In some embodiments, the treatment processes can be performed after patterning and partial integration. Examples of treatment processes include remote or direct plasma exposure, thermal anneal, e-beam exposure, ultra-violet radiation exposure and microwave exposure.

FIG. 1 is flow diagram illustrating certain operations in a method of fabricating a device, display or other article using a dielectric film having a tunable property, such as WER. The method can be used in the fabrication of semiconductor devices, displays, LEDs, photovoltaic panels and the like. In semiconductor device fabrication, the methods can be used for back end of the line (BEOL) applications and front end of line (FEOL) applications. In some embodiments, the methods can include applications in which high aspect ratio gaps are filled with insulating material. Examples include shallow trench isolation (STI) and formation of inter-metal dielectric (IMD) layers, inter-layer dielectric (ILD) layers, pre-metal dielectric (PMD) layers, passivation layers, and filling gaps at the interconnect level. Further examples include formation of sacrificial layers for air gap formation or lift-off layers. Sacrificial applications such as air gap formation or lift-off layers.

The method begins by forming a flowable dielectric film having a tunable property (101). Formation of the flowable dielectric film can involve one or more initial deposition reactions followed by a post-deposition treatment. In some embodiments, the flowable dielectric film is no longer flowable or has reduced flowability at the end of block 101. Methods of forming flowable dielectric films are described further below with reference to FIGS. 2 and 3. According to various embodiments, the flowable dielectric film may or may not partially or wholly fill one or more gaps. In some embodiments, a blanket layer of the dielectric film can be formed. In some embodiments, a layer such an overburden layer may be deposited above the height of filled gaps.

The value of the tunable property of the film formed in block 101 can be relatively low or high depending on the particular integration process. Methods of targeting particular WER's and other properties are described further below. Regardless of the value of the tunable of the dielectric film formed in block 101, the property is tunable and can be modified in subsequent processing. Moreover, in some embodiments, multiple properties of the film are tunable, such as WER and dry etch rate. In some embodiments, block 101 involves targeting a certain dopant concentration or range or concentrations within the film.

After a dielectric film having a tunable property is formed in block 101, one or more integration processes is performed (103). Integration processes can include, but are not limited to, lithography, ion implantation, thin film deposition, chemical mechanical planarization (CMP), photoresist strip, wet etching, dry etching and the like. In some embodiments, one or more tunable properties of the dielectric film is associated with one or more processes performed in block 103; for example, the dielectric film can have a tunable WER, with a wet etch performed in block 103. In another example, the dielectric film can have a tunable dry etch rate, with a dry etch performed in block 103. Block 103 can be performed prior to any modification of the tunable property of the dielectric film, with the value of the tunable property targeted in block 101 appropriate for block 103.

After the one or more integration processes are performed, the tunable property is modified (105). Modifying a tunable property is described in more detail below with respect to FIGS. 5A-8D, below. In certain embodiments, it can include exposing the flowable dielectric film to activated species, for example, activated species generated by an in situ or remote plasma generator. In certain embodiments, it can include exposing the flowable dielectric film to ultraviolet radiation or other electromagnetic radiation. Examples of treatment processes include plasma exposure, thermal anneal, e-beam exposure and microwave exposure. In certain embodiments, the concentration of one or more dopants or other chemical constituents of the dielectric film is modified.

The method continues by performing one or more additional integration processes (107). As noted above, integration processes can include, but are not limited to lithography, ion implantation, thin film deposition, CMP, photoresist strip, wet etching, dry etching and the like. In some embodiments, one or more tunable properties of the dielectric film is associated with one or more processes performed in block 107, with the value of the tunable property targeted in block 105 appropriate for block 107. In some embodiments, blocks 105 and 107 can be repeated one or more times during fabrication. The value of the tunable property can be either raised or lowered during each modification operation. For example, in some embodiments, a tunable property may be increased in a first modification operation and decreased in a subsequent modification operation.

Figure 2:
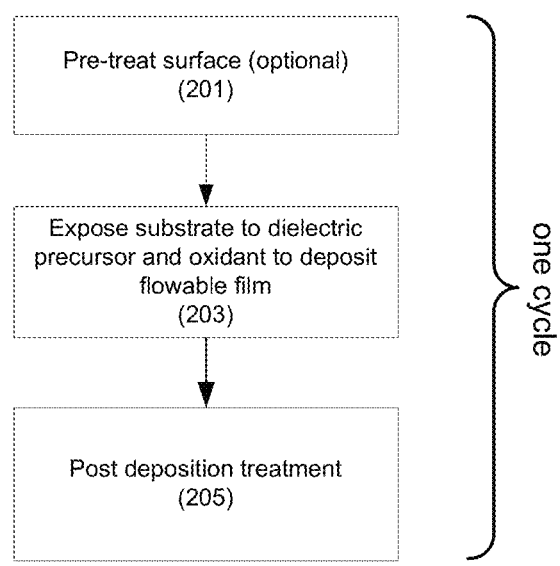
FIG. 2 is a flow diagram illustrating certain operations in a method of forming a flowable dielectric material on surface.

FIG. 2 is a flow diagram illustrating certain operations in a method of forming a flowable dielectric material on surface according to certain embodiments. The method begins by performing an optional pretreatment operation on the deposition surface (201). The deposition surface can be, for example, a solid silicon-containing material or a metal. In some embodiments, the deposition surface may include surfaces of a recessed feature, also referred to as a gap, that the flowable dielectric will partially or wholly fill. In many cases, the gaps are narrow, having critical dimensions on the order of about 1-50 nm, in some cases between about 2-30 nm or 4-20 nm, e.g. 13 nm. This refers to the width of the gap opening at its narrowest point. The methods are not necessarily limited to these ranges, but can be used with smaller or larger gaps as well. In certain embodiments, one or more of the gaps on the substrate is re-entrant such that the sidewalls of the gap narrow from the bottom of the gap towards the gap opening.

A gap can be defined by a bottom surface and sidewalls. The term sidewall or sidewalls may be used interchangeably to refer to the sidewall or sidewalls of a gap of any shape, including a round hole, a long narrow trench, etc. The sidewall and bottom surfaces that define a gap may be one or multiple materials. Examples of deposition surfaces such as gap sidewall and/or bottom surface materials include nitrides, oxides, carbides, oxynitrides, oxycarbides, silicides, as well as bare silicon or other semiconductor material. Particular examples include SiN, $SiO_2$, SiC, SiON, NiSi, polysilicon and any other silicon-containing material. Further examples of gap sidewall and/or bottom materials used in BEOL processing include copper, tantalum, tantalum nitride, titanium, titanium nitride, ruthenium and cobalt.

In some embodiments, a pretreatment operation can decrease nucleation delay and improve bottom up fill. The treatment may also improve nucleation uniformity or interface adhesion between the flowable dielectric film and substrate material. The treatment may also improve surface wetting and increase hydrophilicity. According to various embodiments, all or only a subset of deposition surfaces can be pretreated. For example, all surfaces of a gap can be pretreated or a bottom surface can be preferentially pretreated, e.g., by an anisotropic plasma treatment process.

If performed, a pretreatment operation can involve exposure to a plasma containing oxygen, nitrogen, helium, hydrogen, ozone, water, ammonia or some combination of these such as $H2/N2$, $H2/H_2O$, $O_2/H_2O$, $H_2O$, $NH_3/N_2$ or $NH_3/H_2$. The plasma may be downstream or in situ, generated by a remote plasma generator, such as an Astron® remote plasma source, an inductively-coupled plasma generator or a capacitively-coupled plasma generator. Examples of pre-treatment gases include $O_2$, $O_3$, $H_2O$, NO, $NO_2$, $N_2O$, $H_2$, $N_2$, He, Ar, and combinations thereof, either alone or in combination with other compounds. Examples of chemistries include $O_2$, $O_2/N_2$, $O_2/He$, $O_2/Ar$, $O_2/H_2$ and $H_2/He$. The particular process conditions may vary depending on the implementation. In alternate embodiments, the pretreatment operation involves exposing the substrate to $O_2$, $O_2/N_2$, $O_2/He$, $O_2/Ar$ or other pretreatment chemistries, in a non-plasma environment. The particular process conditions may vary depending on the implementation. In these embodiments, the substrate may be exposed to the pretreatment chemistry in the presence energy from another energy source, including a thermal energy source, an ultraviolet source, a microwave source, etc. In certain embodiments, in addition to or instead of the pretreatment operations described above, a substrate is pretreated with exposure to a catalyst, surfactant, adhesion-promoting chemical, or wetting-promoting chemical. The pretreatment operation, if performed, may occur in the deposition chamber or may occur in another chamber prior to transfer of the substrate to the deposition chamber. Further description of pretreatment operations is provided in U.S. patent application Ser. No. 13/313,735, incorporated by reference herein. After pretreatment, the substrate can then be transferred to a flowable dielectric deposition module under inert atmosphere or vacuum. Examples of inert atmospheres include He, Ar and $N_2$. In some embodiments, the pretreatment is not performed or is performed in situ in the deposition module with no transfer operation performed.

Returning to FIG. 2, the surface is then exposed to reactants to deposit a flowable dielectric film (203). Depositing a flowable oxide film, for example, can involve exposing the substrate to gaseous reactants including a dielectric precursor and an oxidant such that a condensed flowable film forms in the gap. According to various embodiments, various reaction mechanisms may take place including one or more of the reaction(s) occurring in the gap and reaction(s) occurring of on field regions with at least some of film flowing into the gap. Examples of deposition chemistries and reaction mechanisms according to various embodiments are described below; however, the methods are not limited to a particular chemistry or mechanism. In some embodiments to deposit a silicon oxide film, the dielectric precursor is a silicon-containing compound and the oxidant a compound such as a peroxide, ozone, oxygen, steam, etc. In some embodiments, the oxidant is a non-hydroxyl-forming oxidant such as ozone or oxygen. As described further below, the deposition chemistry may include on or more of a solvent and a catalyst as well.

The process gases may be introduced into the reactor simultaneously, or one or more component gases may be introduced prior to the others. U.S. patent application Ser. No. 12/566,085, incorporated by reference herein, provides a description of reactant gas sequences that may be used in accordance with certain embodiments. The reaction may be a non-plasma (chemical) reaction or be a plasma-assisted reaction. U.S. patent application Ser. No. 12/334,726, incorporated by reference herein, describes depositing flowable dielectric films by plasma-enhanced chemical vapor deposition (PECVD) processes.

If the flowable dielectric material is used to fill a gap, the deposition operation may proceed until the gap is only partially filled, or at least until the gap is wholly filled, with flowable dielectric material according to various embodiments. In certain embodiments, the entire desired thickness of dielectric material can be formed via a single cycle, with a cycle including pretreatment, if performed, deposition, and post-deposition treatment. In some other embodiments, a multi-cycle reaction is performed, and only a portion of the material to be formed, for example, in block 101 of FIG. 1 is deposited in block 203 of FIG. 2.

After the deposition operation, a post-deposition treatment operation is performed (107). The post-deposition treatment operation may include one or more operations to densify the as-deposited film and/or chemically convert the as-deposited film to the desired dielectric material. For example, the post-deposition treatment may involve an oxidizing plasma that converts the film to an Si—O network and shrinks the film. In some embodiments, different operations may be performed for conversion and physical densification. Densification treatments may also be referred to as cures or anneals. The post-deposition treatment may be performed in situ, i.e., in the deposition module, or ex situ in another module, or in a combination of both. Further description of post-deposition treatment operations is provided below. According to various embodiments, a post-treatment operation may affect all, or only a top portion, of the deposited film. For example, in certain embodiments, exposure to an oxidizing plasma oxidizes the entire depth of the deposited film but physically densifies only a top portion. In other embodiments, the entire thickness deposited in the preceding operation is physically densified.

Deposition Chemistries

For forming silicon oxides, the process gas reactants generally include a silicon-containing compound and an oxidant, and may also include a catalyst, a solvent (and/or other surfactant) and other additives. The gases may also include one or more dopant precursors, e.g., a carbon-, nitrogen-, fluorine-, phosphorous- and/or boron-containing gas. Sometimes, though not necessarily, an inert carrier gas is present. In certain embodiments, the gases are introduced using a liquid injection system. In certain embodiments, the silicon-containing compound and the oxidant are introduced via separate inlets or are combined just prior to introduction into the reactor in a mixing bowl and/or showerhead. The catalyst and/or optional dopant may be incorporated into one of the reactants, pre-mixed with one of the reactants or introduced as a separate reactant. The substrate can be then exposed to the process gases, for example, at block 203 in FIG. 2. In some embodiments, conditions in the reactor are such that the silicon-containing compound and the oxidant react to form a condensed flowable film on the substrate. Formation of the film may be aided by presence of a catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. The substrate is exposed to the process gases for a period sufficient to deposit the desired amount of flowable film. For gapfill, the deposition may proceed long enough to fill at least some of the gap or overfill the gap as desired.

In certain embodiments, the silicon-containing precursor is an alkoxysilane. Alkoxysilanes that may be used include, but are not limited to, the following:

$H_x$—Si—$(OR)_y$ where x=0-3, x+y=4 and R is a substituted or unsubstituted alkyl group;

$R'_x$—Si—$(OR)_y$ where x=0-3, x+y=4, R is a substituted or unsubstituted alkyl group and R' is a substituted or unsubstituted alkyl, alkoxy or alkoxyalkane group; and $H_x(RO)_y$—Si—Si—$(OR)_yH_x$ where x=0-2, x+y=3 and R is a substituted or unsubstituted alkyl group.

Examples of silicon containing precursors include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), tetraisocyanatesilane (TICS), bis-tert-butylamino silane (BTBAS), hydrogen silsesquioxane, tert-butoxydisilane, T8-hydridospherosiloxane, OctaHydro POSS™ (Polyhedral Oligomeric Silsesquioxane) and 1,2-dimethoxy-1,1,2,2-tetramethyldisilane. Further examples of silicon containing precursors include, but are not limited to, silane ($SiH_4$), disilane, trisilane, hexasilane, cyclohexasilane, and alkylsilanes, e.g., methylsilane, and ethylsilane.

In certain embodiments, carbon-doped silicon precursors are used, either in addition to another precursor (e.g., as a dopant) or alone. Carbon-doped precursors can include at least one Si—C bond. Carbon-doped precursors that may be used include, but are not limited to the, following:

$R'_x$—Si—$R_y$ where x=0-3, x+y=4, R is a substituted or unsubstituted alkyl group and R' is a substituted or unsubstituted alkyl, alkoxy or alkoxyalkane group; and $SiH_xR'_y$—$R_z$ where x=1-3, y=0-2, x+y+z=4, R is a substituted or unsubstituted alkyl group and R' is a substituted or unsubstituted alkyl, alkoxy or alkoxyalkane group.

Examples of carbon-doped precursors are given above with further examples including, but not being limited to, trimethylsilane (3MS), tetramethylsilane (4MS), diethoxymethylsilane (DEMS), dimethyldimethoxysilane (DMDMOS), methyl-triethoxysilane (MTES), methyl-trimethoxysilane, methyl-diethoxysilane, methyl-dimethoxysilane, trimethoxymethylsilane, (TMOMS), dimethoxymethylsilane, and bis(trimethylsilyl)carbodiimide.

In certain embodiments aminosilane precursors are used. Aminosilane precursors include, but are not limited to, the following:

$H_x$—Si—$(NR)_y$ where x=0-3, x+y=4 and R is an organic of hydride group.

Examples of aminosilane precursors are given above, with further examples including, but not being limited to -tert-butylamino silane (BTBAS) or tris(dimethylamino)silane.

Examples of suitable oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). In certain embodiments, a remote plasma generator may supply activated oxidant species.

One or more dopant precursors, catalysts, inhibitors, buffers, surfactants, solvents and other compounds may be introduced. In certain embodiments, a proton donor catalyst is employed. Examples of proton donor catalysts include 1) acids including nitric, hydrofluoric, phosphoric, sulphuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_xX_yH_z$ where x=1-2, y=1-3, z=1-3 and X is a halide; 4) $R_xSi—X_y$ where x=1-3 and y=1-3; R is alkyl, aloxy, aloxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated molecules, including halogenated organic molecules, such as dichlorosilane ($SiCl_2H_2$), trichlorosilane ($SiCl_3H$), methylchlorosilane ($SiCH_3ClH_2$), chlorotriethoxysilane, chlorotrimethoxysilane, chloromethyldiethoxysilane, chloromethyldimethoxysilane, vinyltrichlorosilane, diethoxydichlorosilane, and hexachlorodisiloxane. Acids which may be used may be mineral acids such as hydrochloric acid (HCl), sulphruic acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chloro-diethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCl_2CO_2H$), oxalic acid ($HO_2CCO_2H$), benzoic acid ($C_6H_5CO_2H$), and triethylamine.

According to various embodiments, catalysts and other reactants may be introduced simultaneously or in particular sequences. For example, in some embodiments, an acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Some examples of catalysts are given above. Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane. Methods of rapid delivery that may be employed are described in U.S. application Ser. No. 12/566, 085, incorporated by reference herein.

Surfactants may be used to relieve surface tension and increase wetting of reactants on the substrate surface. They may also increase the miscibility of the dielectric precursor with the other reactants, especially when condensed in the liquid phase. Examples of surfactants include solvents, alcohols, ethylene glycol and polyethylene glycol. Difference surfactants may be used for carbon-doped silicon precursors because the carbon-containing moiety often makes the precursor more hydrophobic.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

As indicated above, any of the reactants (silicon-containing precursor, oxidant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off.

Reactions conditions can be such that the silicon-containing compound and oxidant undergo a condensation reaction, condensing on the substrate surface to form a flowable film. In certain embodiments, the reaction takes place in dark or non-plasma conditions. In other embodiments, the reaction takes place in the presence of a plasma, generated either remotely or in the deposition chamber. Methods of depositing a flowable film for gap fill via a plasma-enhanced chemical vapor deposition (PECVD) reaction are described in U.S. patent application Ser. No. 12/334,726, incorporated by reference herein.

Chamber pressure may be between about 1 and 200 Torr, in certain embodiments, it is between 10 and 75 Torr. In a particular embodiment, chamber pressure is about 10 Torr.

Partial pressures of the process gas components may be characterized in terms of component vapor pressure and range as follows, with Pp the partial pressure of the reactant and Pvp the vapor pressure of the reactant at the reaction temperature.

Precursor partial pressure ratio (Pp/Pvp)=0.01-1, e.g., 0.01-0.5
Oxidant partial pressure ratio (Pp/Pvp)=0.25-2, e.g., 0.5-1
Solvent partial pressure ratio (Pp/Pvp)=0-1, e.g, 0.1-1

In certain embodiments, the process gas is characterized by having a precursor partial pressure ratio is 0.01 and 0.5, an oxidant partial ratio between 0.5 and 1, and a solvent (if present) partial pressure ratio between 0.1 and 1. In the same or other embodiments, the process gas is characterized by the following:
Oxidant:Precursor partial pressure ratio ($Pp_{oxidant}/Pp_{precursor}$)=0.2-30, e.g., 5-15
Solvent:Oxidant partial pressure ratio ($Pp_{solvent}/Pp_{oxidant}$)=0-30, e.g., 0.1-5

In certain embodiments, the process gas is characterized by an oxidant:precursor partial pressure ratio of between about 5 and 15 and a solvent:oxidant partial pressure ration of between about 0.1 and 5.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may require increased pressure. In one embodiment, the temperature is about 5° C. and the pressure about 10 Torr. Exposure time depends on reaction conditions as well as the desired film thickness. Deposition rates are from about 100 angstroms/min to 1 micrometer/min according to various embodiments. In certain embodiments, deposition time is 0.1-180 seconds, e.g., 1-90 seconds.

The substrate is exposed to the reactants under these conditions for a period long enough to deposit a flowable film. As noted above, the entire desired thickness of film can be deposited in block 203, if it is a single cycle deposition. In other embodiments that employ multiple deposition operations, only a portion of the desired film thickness is deposited in a particular cycle. According to various embodiments, the substrate can be continuously exposed to the reactants during block 203, or one or more of the reactants may be pulsed or otherwise intermittently introduced. Also as noted above, in certain embodiments, one or more of the reactants including a dielectric precursor, oxidant, catalyst or solvent, may be introduced prior to introduction of the remaining reactants.

Returning to FIG. 2, the flowable film is exposed to a post-deposition treatment (205). This may be done in situ, in the deposition chamber, in another chamber. The post-deposition treatment operation may involve one or more operations, any or all of which may also result in physically densifying and/or chemically converting the as-deposited film. In some embodiments, physical densification involves replacing smaller species with larger species, which may result in volume expansion. For example, a Si—H species may be replaced with a Si—O species. The expanded film will typically still be denser.

In some embodiments, a post-deposition treatment may densify without chemical conversion. In certain embodiments, one conversion operation may be separately performed, or not performed at all. If separately performed, a conversion operation may be performed before or after a densification operation. In one example, a film is converted and partially densified by exposure to a reactive plasma followed by further densification by thermal anneal in an inert environment.

According to various embodiments, the film may be densified by purely thermal anneal, exposure to a downstream or direct plasma, exposure to ultraviolet or microwave radiation or exposure to another energy source. Thermal anneal temperatures may be 300° C. or greater (depending on the allowable thermal budget). The treatment may be performed in an inert environment (Ar, He, etc.) or in a potentially reactive environment. Oxidizing environments (using $O_2$, $N_2O$, $O_3$, $H_2O$, $H_2O_2$, NO, $NO_2$, CO, $CO_2$ etc.) may be used, though in certain situation nitrogen-containing compounds will be avoided to prevent incorporation of nitrogen in the film. In other embodiments, nitridizing environments (using $N_2$, $N_2O$, $NH_3$, NO, $NO_2$ etc.) can be used and can incorporate a certain amount of nitrogen in the film. In some embodiments, a mix of oxidizing and nitridizing environments are used. Carbon-containing chemistries may be used to incorporate some amount of carbon into the deposited film. According to various embodiments, the composition of the densified film depends on the as-deposited film composition and the treatment chemistry. For example, in certain embodiments, an $Si(OH)_x$ as-deposited gel is converted to a SiO network using an oxidizing plasma cure. In other embodiments, a $Si(OH)_x$ as-deposited gel is converted to a SiON network In other embodiments, an $Si(NH)_x$ as-deposited gel is converted to an SiON network.

In certain embodiments, the film is treated by exposure to a plasma, either remote or direct (inductive or capacitive). This may result in a top-down conversion of the flowable film to a densified solid film. The plasma may be inert or reactive. Helium and argon plasmas are examples of inert plasmas; oxygen and steam plasmas are examples of oxidizing plasmas (used for example, to remove carbon as desired). Hydrogen-containing plasmas may also be used. An example of a hydrogen-containing plasma is a plasma generated from a mix of hydrogen gas ($H_2$) and a diluent such as inert gas. Temperatures during plasma exposure are typically about 25° C. or higher. In certain embodiments, an oxygen or oxygen-containing plasma is used to remove carbon. In some embodiments, temperature during plasma exposure can be lower, e.g., −15° C. to 25° C.

Temperatures during block 205 may range from 0-600° C., with the upper end of the temperature range determined by the thermal budget at the particular processing stage. For example, in certain embodiments, the entire process shown in FIG. 1 or FIG. 2 can be carried out at temperatures less than about 400° C. This temperature regime is compatible with NiSi or NiPtSi contacts. In certain embodiments, the temperatures range from about 200° C.-550° C. Pressures may be from 0.1-10 Torr with high oxidant pressures used for removing carbon.

Other annealing processes, including rapid thermal processing (RTP) may also be used to solidify and shrink the film. If using an ex situ process, higher temperatures and other sources of energy may be employed. Ex situ treatments include high temperature anneals (700-1000° C.) in an environment such as $N_2$, $O_2$, $H_2O$, Ar and He. In certain embodiments, an ex situ treatment involves exposing the film to ultraviolet radiation, e.g., in an ultraviolet thermal processing (UVTP) process. For example, temperatures of 100° C., or above, e.g., 100° C.-400° C., in conjunction with UV exposure may be used to cure the film. Other flash curing processes, including RTP or laser anneal, may be used for the ex situ treatment as well.

In some embodiments, block 205 is not performed. For example, in some integration schemes, block 103 in FIG. 1 can be performed after block 203. In some embodiments, block 205 can involve partial densification of the film deposited in block 203. One example of an integration process including partial densification of a flowable dielectric film is described in U.S. patent application Ser. No. 13/315,123, filed Dec. 8, 2011, which is incorporated by reference herein.

The flowable dielectric deposition may involve various reaction mechanisms depending on the specific implementation. Examples of reaction mechanisms in a method of depositing a flowable oxide film according to certain embodiments are described below. It should be noted that while these reaction steps provide a useful framework for describing various aspects of the invention, the methods described herein are not necessarily limited to a particular reaction mechanism.

In some embodiments, the overall deposition process may be described in context of two steps: hydrolysis and condensation. The first step involves hydrolysis of silicon-containing precursors by the oxidant. For example, alkoxy groups (—OR) of the silicon containing precursor may be replaced with hydroxyl groups (—OH). The —OH groups and the residual alkoxy groups participate in condensation reactions that lead to the release of water and alcohol molecules and the formation of Si—O—Si linkages. In this mechanism, the as-deposited film may not have appreciable carbon content even though the alkoxysilane precursor contains carbon. In certain embodiments, reactant partial pressure is controlled to facilitate bottom up fill. Liquid condensation can occur below saturation pressure in narrow gaps; the reactant partial pressure controls the capillary condensation. In certain embodiments, reactant partial pressure is set slightly below the saturation vapor pressure. In a hydrolyzing medium, the silicon-containing precursor forms a fluid-like film on the wafer surface that preferentially deposits in trenches due to capillary condensation and surface tension forces, resulting in a bottom-up fill process.

It should be noted that the methods described herein are not limited to the particular reactants, products and reaction mechanisms described, but may be used with other reactants and reaction mechanisms that produce flowable dielectric films. It will also be understood that deposition and annealing may involve multiple different concurrent or sequential reaction mechanisms.

An example of reactant condensation, hydrolysis and initiation of a flowable dielectric film on a deposition surface follows. The deposition surface is held at a reduced temperature such as −15° C. to 30° C., e.g., −5° C. The reactants include a silicon-containing dielectric precursor, an oxidant, an optional catalyst and an optional solvent. The dielectric precursor absorbs on the surface. A liquid phase reaction between the precursor and oxidant results in hydrolysis of the precursor, forming a product, e.g., silanols $Si(OH)_x$ that are attached to the deposition surface, initiating the growth of the film. In certain embodiments, the presence of the solvent improves miscibility and surface wettability.

Polymerization of the product to form, for example, $Si(OH)_x$ chains as well as condensation of the product to form, for example, crosslinked Si—O chains can follow. The result of the condensation reaction is an as-deposited dielectric film. At this stage, the organic groups may be substantially eliminated from the film, with alcohol and water released as byproducts, though Si—H groups and hydroxyl groups can remain. In some cases, a minute but detectable amount of carbon groups remains. The overall carbon content may be less than 1% (atomic). In some embodiments, essentially no carbon groups remain, such that Si—C groups are undetectable by FTIR. Continuing the example, the as-deposited film can be annealed in the presence of an activated oxygen species, e.g. oxygen radicals, ions, etc. In certain embodiments, the anneal has two effects: 1) oxidation of the film, to convert SiOH and SiH to SiO; and 2) film densification or shrinkage. The oxygen oxidizes Si—H bonds and facilitates formation of a $SiO_x$ network with substantially no Si—H groups. The substrate temperature may be raised, e.g., to 375° C. to facilitate film shrinkage and oxidization. In other embodiments, the oxidation and shrinkage operations are carried out separately. In some embodiments, oxidation may occur at a first temperature (e.g., 200° C.) with further densification occurring at a higher temperature (e.g., 375° C.).

In some embodiments, densification may be limited by film constraints: for example, film in a gap can be constrained by the sidewalls and the bottom of the gap, with the top of the gap the only free surface. As the critical dimension decreases, less free surface is available, less relaxation is possible and a crust or high density region formed at the free surface is thinner. In some cases film below a high density region does not densify. While the constraints formed by the sidewalls and crust prevent densification, a reactant can diffuse through the crust, forming low density dielectric film. For example, oxygen species can diffuse, oxidizing the SiOH and SiH groups even without substantial densification.

The reaction mechanism described above is but one example of a reaction mechanism that may be used in accordance with the present invention, depending on the particular reactants. For example, in certain embodiments, peroxides are reacted with silicon-containing precursors such as alkylsilanes to form flowable films including carbon-containing silanols. In other embodiments, Si—C or Si—N containing dielectric precursors may be used, either as a main dielectric precursor or a dopant precursor, to introduce carbon or nitrogen in the gel formed by a hydrolysis and condensation reaction as described above. For example, triethoxysilane may be doped with methyl-triethoxysilane $(CH_3Si(OCH_2)_3)$ to introduce carbon into the as-deposited film. Still further, in certain embodiments the as-deposited film is a silicon nitride film, including primarily Si—N bonds with N—H bonds.

In certain embodiments, the flowable dielectric film may be a silicon and nitrogen-containing film, such as silicon nitride or silicon oxynitride. It may be deposited by introducing vapor phase reactants to a deposition chamber at conditions such that they react to form a flowable film. The vapor phase reactants may include species created by a plasma. Such a plasma may be generated remotely or in the deposition chamber. The nitrogen incorporated in the film may come from one or more sources, such as a silicon and nitrogen-containing precursor (for example, trisilylamine (TSA) or disilylamine (DSA)), a nitrogen precursor (for example, ammonia ($NH_3$) or hydrazine ($N_2H_4$)), or a nitrogen-containing gas fed into a plasma ($N_2$, $NH_3$, NO, $NO_2$, $N_2O$). After deposition, the flowable dielectric film may be treated to do one or more of the following: chemical conversion of the as-deposited film and densification. The chemical conversion may include removing some or all of the nitrogen component, converting a $Si(ON)_x$ film to a primarily SiO network. It may also include removal of one or more of —H, —OH, —CH and —NH species from the film. Such a film may be densified as described above. In certain embodiments, it may be primarily SiN after treatment; or may be oxidized to form a SiO network or a SiON network. Post-deposition conversion treatments may remove nitrogen and/or amine groups. As described above, post-deposition treatment may include exposure to thermal, chemical, plasma, UV, IR or microwave energy.

Figure 3:
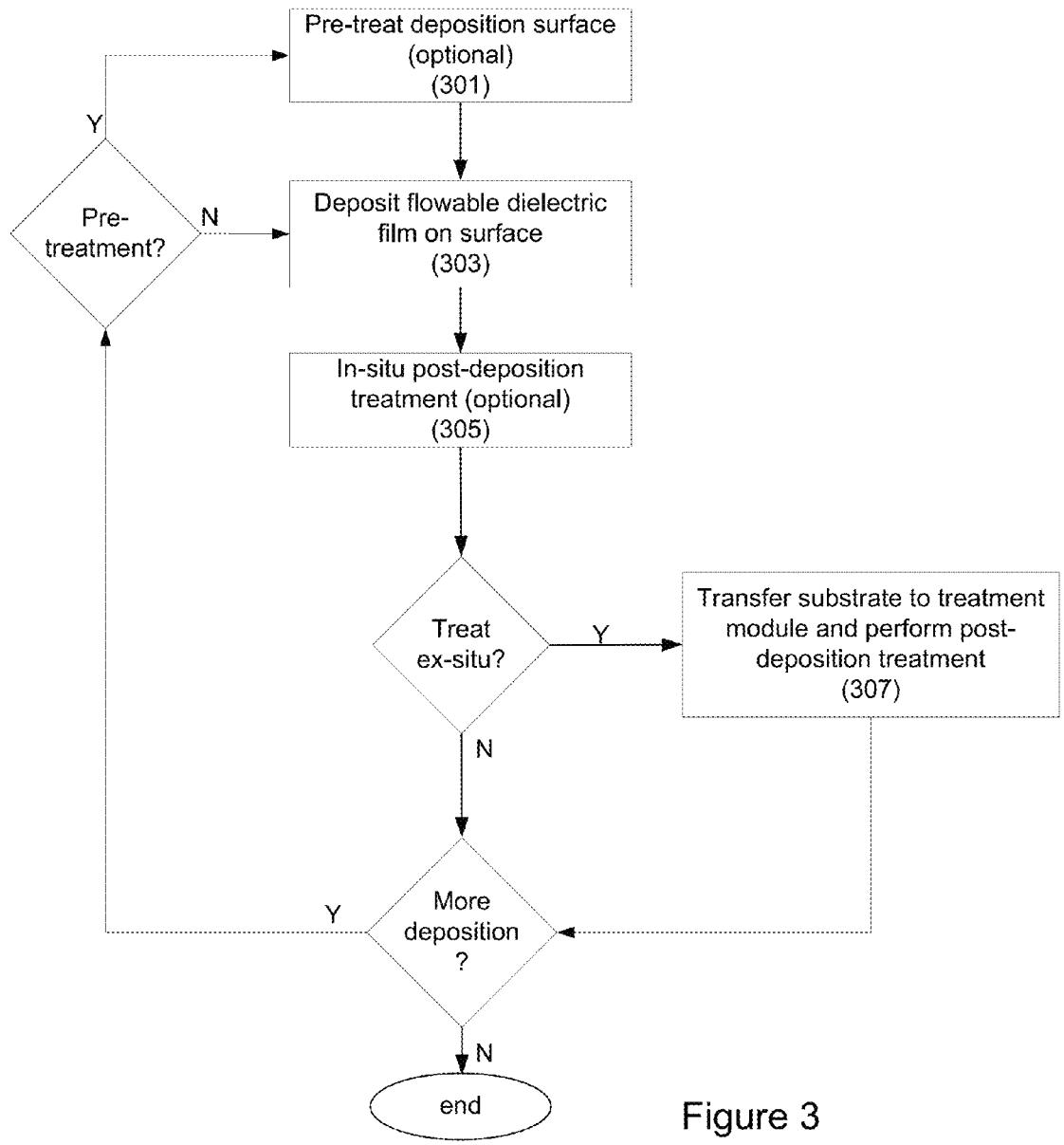
FIG. 3 is a flow diagram illustrating certain operations in a method of forming a flowable dielectric material on surface.

FIG. 3 provides certain operations in a method of forming a flowable dielectric material on surface according to certain embodiments. The method begins with an optional pretreatment of the deposition surface (301). A flowable dielectric film is then deposited on the surface (303). Blocks 301 and 303 can be similar to blocks 201 and 203 of FIG. 2, described above. An optional in situ post-deposition treatment can be performed (305). If performed, the in situ treatment takes place in the deposition module. For example, the in situ treatment can include exposure to UV radiation or a plasma.

Then, if an ex-situ cure is to be performed the wafer is transferred to a treatment module for a post-deposition treatment (307). The treatment module may be the same or a different module as used in pretreatment block 301. If more deposition is desired, the process returns to block 303, or if the substrate is to be pretreated prior to the subsequent deposition, to block 301. In some embodiments, a post-deposition treatment can also pretreat the surface, preparing it for another deposition. This can be in addition to densifying and/or chemically converting the film. For example, in certain embodiments, an $O_2$, $O_3$, $N_2$, $O_2/H_2$, $N_2O$, $NH_3$ or $H_2$ plasma can be used in block 305.

Deposition of Films Having Tunable Properties

According to various embodiments, the processes described herein provide flowable dielectric having certain wet and/or dry etch selectivities or rates.

Dry etch selectivities of as-deposited and densified flowable oxide films were compared to that TEOS oxide. The flowable oxide films were deposited using TES and water, with an ethanol solvent. The flowable oxide film was densified using a remote oxygen plasma. The dry plasma etch rate of the low density flowable oxide was about equal to that of the densified flowable oxide film and that of the PECVD-deposited TEOS oxide film. This indicates that the dry etch selectivity ratios of low density flowable oxide film, densified flowable oxide film, and TEOS oxide were about 1:1:1.

In certain embodiments, tuning the dry etch rate can involve incorporating nitrogen into the film, e.g., exposing the flowable film to an N-containing plasma, such as a high density N-containing plasma.

In certain embodiments, control of the WER can involve controlling the concentration of carbon and/or nitrogen in the flowable dielectric material. Flowable dielectric material can be doped to modify the wet etch rate of the material relative to $SiO_2$. In some embodiments, the doped material may be high density or low density flowable oxide. According to various embodiments, carbon-containing and/or nitrogen-containing dopants are introduced during deposition and/or post-deposition treatment. For example, triethoxysilane may be doped with methyltriethoxysilane ($CH_3Si(OCH_2)_3$) to introduce carbon into the as-deposited film. In an alternative implementation, the methyltriethoxysilane may be used on its own to deposit a carbon-containing film, without another precursor. Other examples of carbon-doped precursors include trimethylsilane (3MS), tetramethylsilane (4MS), diethoxymethylsilane (DEMS), dimethyldimethoxysilane (DMDMOS), methyl-trimethoxysilane (MTMS), methyl-diethoxysilane (MDES), methyl-dimethoxysilane (MDMS) and cyclic azasilanes. Additional carbon-doped precursors are described above with reference to block 203 of FIG. 2. In certain embodiments, the film is doped with extra silicon.

In the same or other embodiments, the film may be doped during anneal, by exposing the film to a carbon-containing, nitrogen-containing and/or silicon-containing atmosphere. As described above, this may be done in the presence of an energy source, e.g., thermal, UV, plasma, or microwave energy. In the same or other embodiments, carbon doping can involve using certain catalysts. Examples of catalysts that may be used for carbon-doped films include chloromethyldiethoxysilane, chloromethyldimethoxysilane, and vinyltrichlorosilane.

Figure 4A:
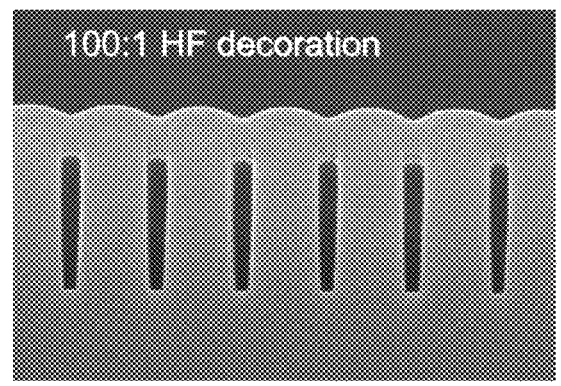
FIGS. 4A and 4B show images comparing the WER of a carbon-containing dielectric film to that of a carbon-free dielectric film.
Figure 4B:
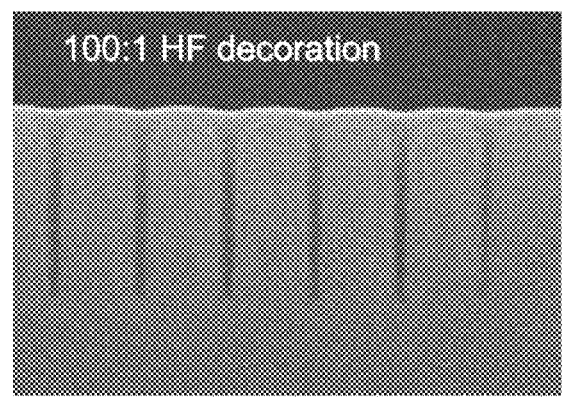

FIGS. 4A and 4B show images comparing the WER of a dielectric film deposited with a carbon-containing dielectric precursor to that of a dielectric film deposited with a carbon-free dielectric precursor. The images are of filled gaps after exposure to dilute HF. FIG. 4A shows results of wet etch of gaps filled using TES (only)/$H_2O$ and FIG. 4B shows results of gaps filled using MTES (only)/$H_2O$ are shown in image 907. As shown, the MTES-deposited film has a lower wet etch rate than the TES-deposited film. While the low WER dielectric fill depicted in FIG. 4B was depositing using only a carbon-doped dielectric precursor, in some embodiments, WER may be modified by doping a dielectric precursor with one or more of the carbon-doped precursors described above. In addition to having lower wet etch rates, films deposited using carbon-doped precursors as described also have lower dielectric constants in certain embodiments.

In certain embodiments, the carbon-doped precursor, either alone or with another dielectric precursor, is reacted with a non-peroxide compound. For example, any of MTES, 3MS, 4MS, DEMS, DMDMOS, MTMS, MDES, MDMS or cyclic azasilanes may be reacted with any of ozone ($O_3$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$).

In certain embodiments, the carbon concentration of a dielectric film having a tunable WER is between about 2% and 45% atomic. In certain embodiments, the nitrogen concentration of a dielectric film having a tunable WER is between about 2% and 60% atomic. According to various embodiments, the WER of the dielectric film after formation (e.g., after block 101 and prior to block 105 in FIG. 1) can be relatively high or low depending on the particular integration process.

Figure 4C:
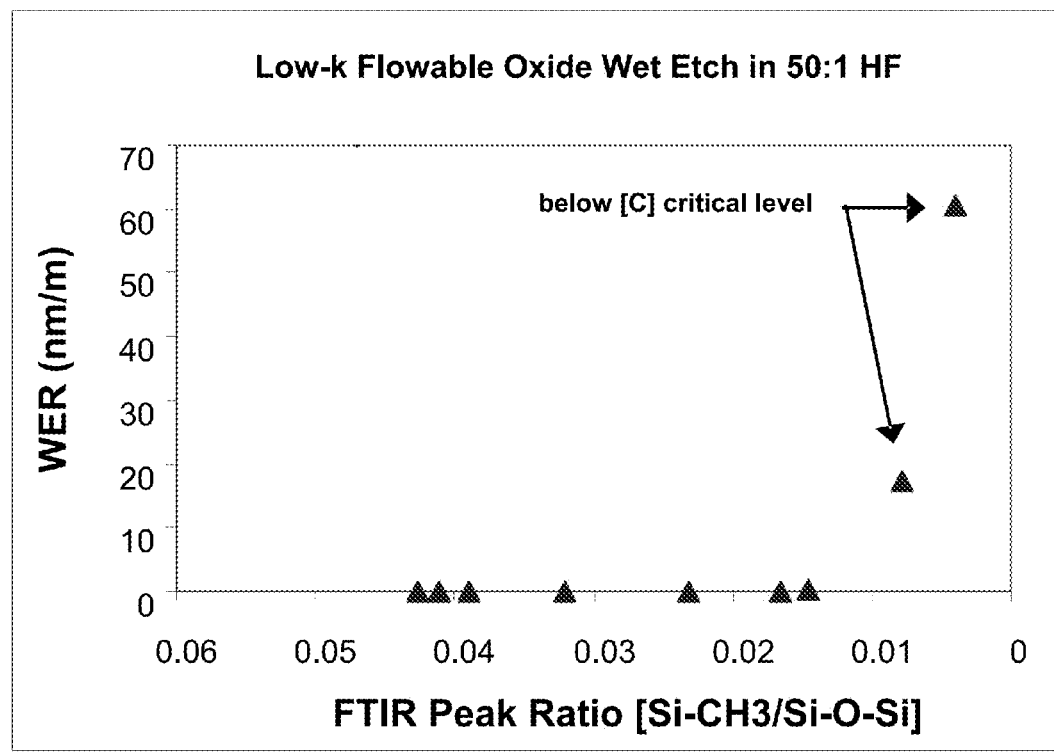
FIG. 4C is a graph showing the wet etch rate (WER) (nm/min) of a low-k flowable oxide material in 50:1 HF as a function of the FTIR peak ratio Si—$CH_3$/Si—O—Si for oxides having various levels of carbon concentration.

In certain embodiments, the flowable dielectric film can have a carbon concentration relative critical level, below which the WER is dependent on the carbon concentration. FIG. 4C is a graph showing the WER (nm/min) of low-k flowable oxide in 50:1 HF as a function of the FTIR peak ratio Si—$CH_3$/Si—O—Si, for oxides having various levels of carbon concentration. FTIR peak ratio Si—$CH_3$/Si—O—Si can be a proxy for carbon concentration, with a peak ratio of about 0.04 corresponding to about 20% atomic C, and peak ratio of about 0.005 corresponding to less than about 10% atomic C.

As shown in FIG. 4C, the WER in 50:1 HF is at or near zero for peak ratios about 0.015. Below the critical level, the WER increases with decreasing carbon concentration. By appropriately controlling the carbon concentration of the film through deposition chemistry and/or post-deposition treatments, a flowable dielectric film having a desired WER can be formed. In some embodiments, a flowable dielectric film having a certain WER can be formed by appropriately controlling the nitrogen concentration through deposition chemistry and/or post-deposition treatments.

In certain embodiments, the initial WER of the flowable dielectric film (e.g., the WER after block 101 of FIG. 1) can be at or near zero, with the film modified after one or more integration processes to increase the WER by reducing the carbon or nitrogen concentration. In certain embodiments, the initial WER can be above zero, for example between about 1 and 100 nm/min, with the film modified after one or more integration processes to increase or decrease the WER by decreasing or increasing the carbon or nitrogen concentration. According to various embodiments, a WER, dry etch rate, or other tunable property can be tunable by at a factor of at least 5, of at least 10, or of at least 50. For example, a film having a tunable WER of 5 nm/m may be modified to increase the WER to at least about 25 nm/m or decrease the WER to 1 nm/m. Details of various modification processes are provided below.

Modifying Flowable Dielectric Film to Tune Properties

As explained above with respect to FIG. 1, a flowable dielectric film can be modified to tune one or more tunable properties of the film. According to various embodiments, modifying the flowable dielectric film to tune one or more properties can involve exposure to activated species, including one or more of ions, electrons, radicals, and high energy molecules. These can be generated in an in situ, downstream or remote plasma generator. Plasma generators include inductively-coupled plasma generators and capacitively-coupled plasma generators. In certain embodiments, modifying the flowable dielectric film to tune one or more properties can involve exposure to electromagnetic radiation, such as UV radiation. In certain embodiments, modifying the flowable dielectric film to tune one or more properties can involve a thermal anneal.

Figure 5A:
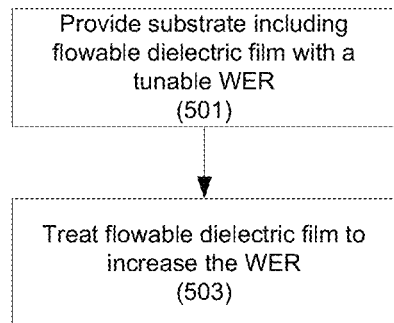
FIGS. 5A and 5B are flow diagrams showing certain operations in methods of modifying flowable dielectric films to tune WER.
Figure 5B:
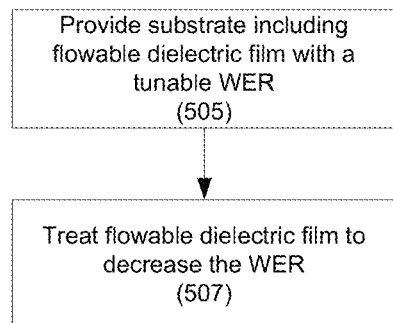

FIGS. 5A and 5B provide flow diagrams showing certain operations in methods of modifying flowable dielectric films to tune WER. First, in FIG. 5A, a substrate including a flowable dielectric film having a tunable WER is provided (501). The substrate can be provided, for example, after block 103 in the method of FIG. 1. Providing the substrate can involve transferring the substrate to a treatment module. In some embodiments, the substrate may be treated in situ in the processing chamber in which the previous processing operation took place. The flowable dielectric film is then treated to increase the WER (503).

Methods of treating the flowable dielectric film to increase the WER include exposure to an oxygen-containing plasma, exposure to a hydrogen-containing plasma, exposure to UV radiation, and thermal anneal. In some embodiments, increasing the WER can involve reduce the carbon and/or nitrogen concentration of the flowable dielectric film.

Reducing the carbon concentration can include oxygen-based plasma processing including dry etch processes and strip/ash processes and hydrogen-based plasma processing including strip/ash processes, UV cure, and thermal annealing. Reducing the nitrogen concentration can also include oxygen-based plasma processing including dry etch processes and strip/ash processes. In certain embodiments, the flowable dielectric films can be exposed to ozone or other reactive oxygen chemistries to remove carbon and/or nitrogen.

Removing carbon by UV cure involves using appropriate process parameters including temperature, time, lamp intensity and wavelength and the gas environment. For example, carbon can be removed using a diffusion H+ lamp at a temperature of about 400° C. or greater for longer than 5 minutes at greater than 80% intensity in an inert gas environment. Removal of carbon can be achieved at lower temperatures and shorter times in an oxidizing environment. Removing carbon by thermal anneal can involve heating the flowable dielectric film to about 550° C. or above. In some embodiments, the flowable film can be annealed in the presence of steam.

Turning to FIG. 5B, a substrate including a flowable dielectric film having a tunable WER is provided (505). The substrate can be provided, for example, after block 103 in the method of FIG. 1. Providing the substrate can involve transferring the substrate to a treatment module. In some embodiments, the substrate may be treated in situ in the processing chamber in which the previous processing operation took place. The flowable dielectric film is then treated to decrease the WER (507).

Methods of treating the flowable dielectric film to decrease the WER include increasing the carbon and/or nitrogen concentration of the flowable dielectric film. This can involve exposure to nitrogen- and carbon-containing chemistries as described above with respect to block 205 of FIG. 2.

In some embodiments, methods of decreasing the WER can include decreasing hydrogen concentration. An as-deposited USG flowable oxide film can have a very high WER in HF chemistry. Methods of treating it can include exposing to an oxidizing cure to remove hydrogen concentration and reduce the etch rate. For example, the WER can be reduced to 2:1 relative to thermal oxide.

Figure 6:
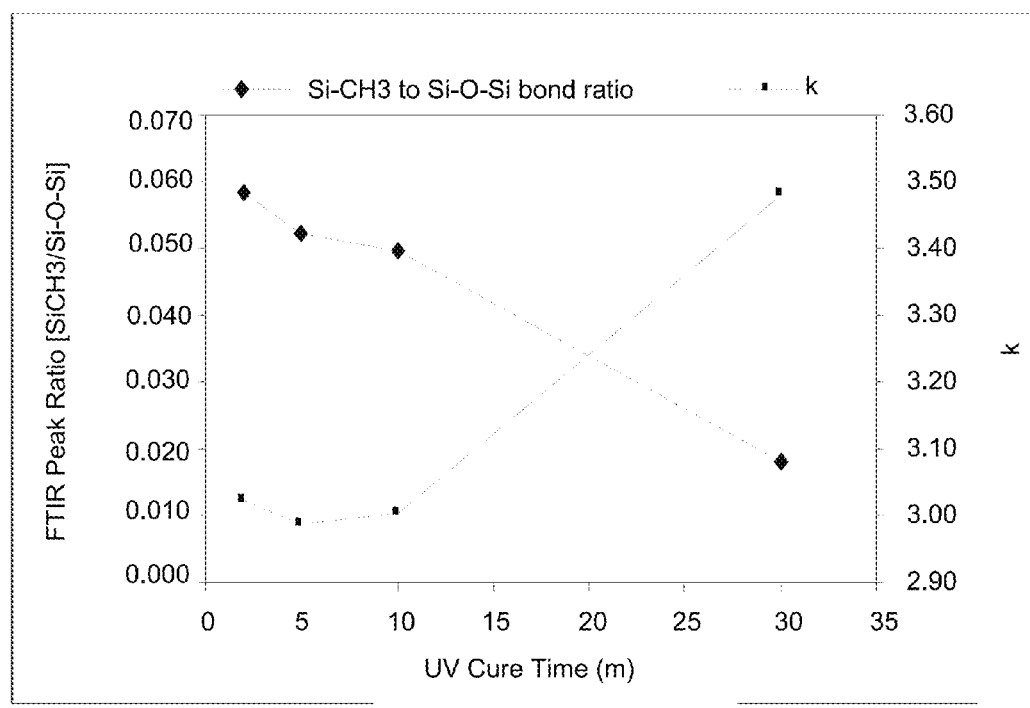
FIG. 6 is a graph showing the dependence of carbon content (measured as FTIR peak ratio of Si—$CH_3$/Si—O—Si) and dielectric constant of a carbon-containing low-k flowable dielectric after UV cure.

FIGS. 6-8D show experimental results of modifying a WER of a flowable dielectric film by various methods. FIG. 6 is a graph showing the dependence of carbon content (measured as FTIR peak ratio of Si—$CH_3$/Si—O—Si) and dielectric constant of a carbon-containing low-k flowable dielectric after UV cure. As UV cure time increases, the carbon concentration in the film decreases. That decrease results in an increase in dielectric constant. Referring to FIG. 5, described above, the WER increases with decreasing carbon concentration if the carbon concentration is below a critical level. Accordingly, UV cure can be used to increase the WER.

Figure 7:
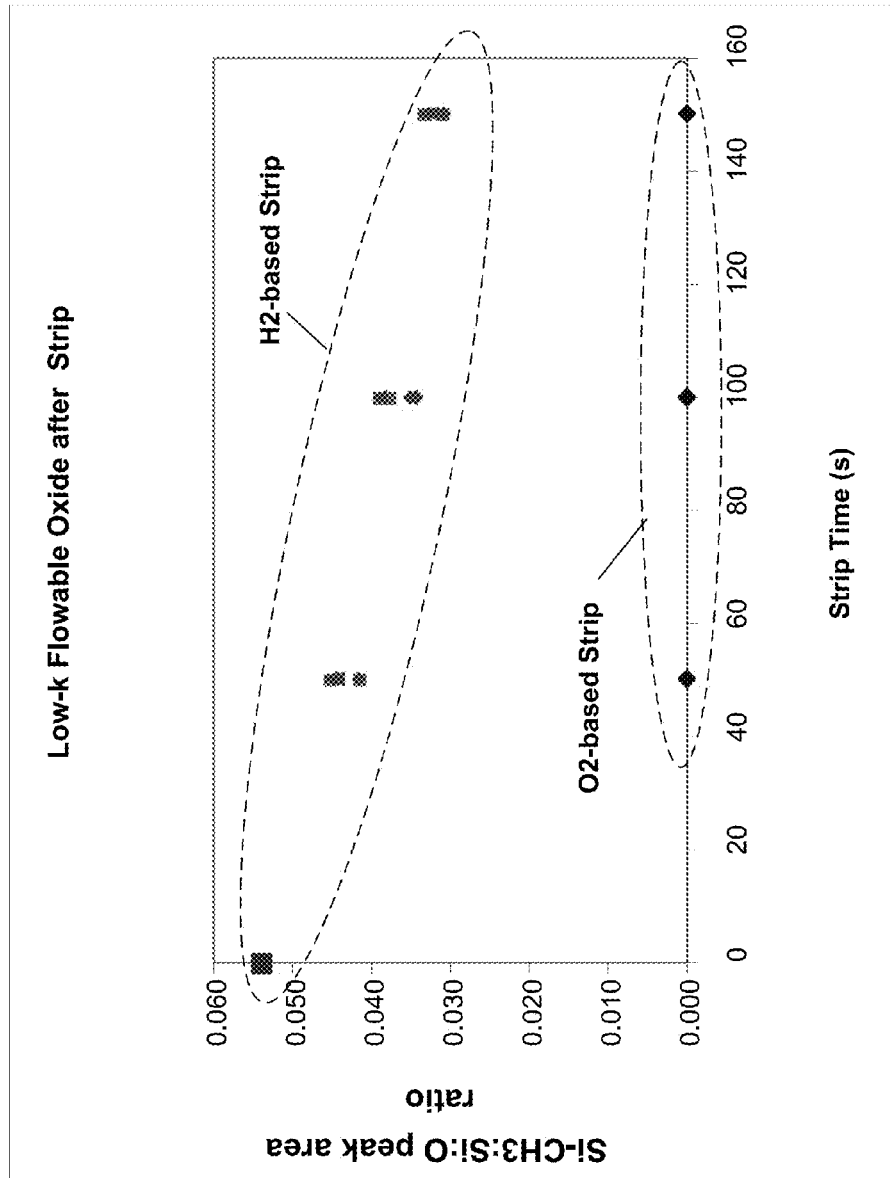
FIG. 7 is a graph showing the dependence of carbon content (measured as FTIR peak ratio of Si—$CH_3$/Si—O—Si) of a carbon-containing low-k flowable dielectric after 1) $H_2$-based strip and 2) $O_2$-based strip conducted in a downstream inductively coupled plasma (ICP) strip tool.

FIG. 7 is a graph showing the dependence of carbon content (measured as FTIR peak ratio of Si—$CH_3$/Si—O—Si) of a carbon-containing low-k flowable dielectric after 1) a $H_2$-based plasma process and 2) an $O_2$-based plasma process conducted in a downstream inductively coupled plasma (ICP) strip tool. The $H_2$-based strip process removed some carbon, with carbon removal increasing with strip time. The $O_2$-based strip process removed nearly all carbon from the low-k flowable oxide. Accordingly, $O_2$-based and $H_2$-based strip processes can be used to increase the WER and to target certain WER's.

Figure 8B:
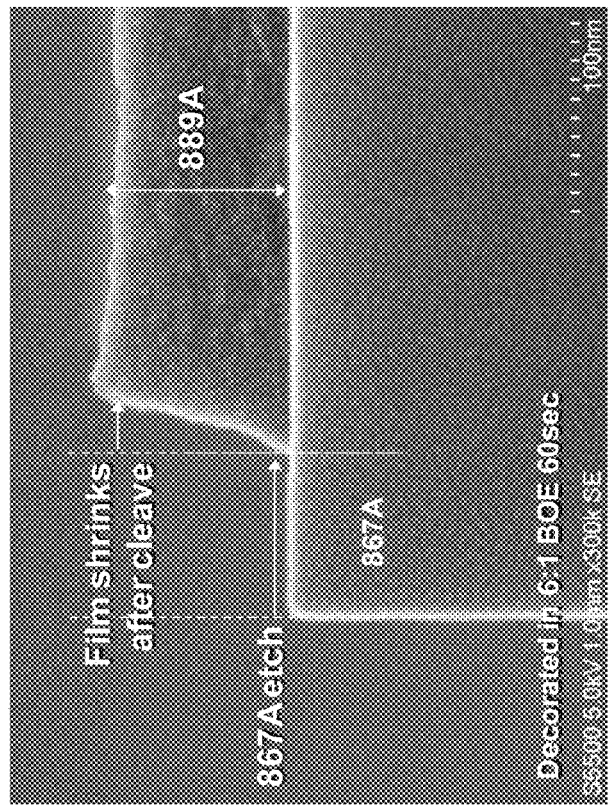
FIGS. 8A and 8B show images of a low-k flowable dielectric film before and after an $O_2$-based plasma treatment.
Figure 8A:
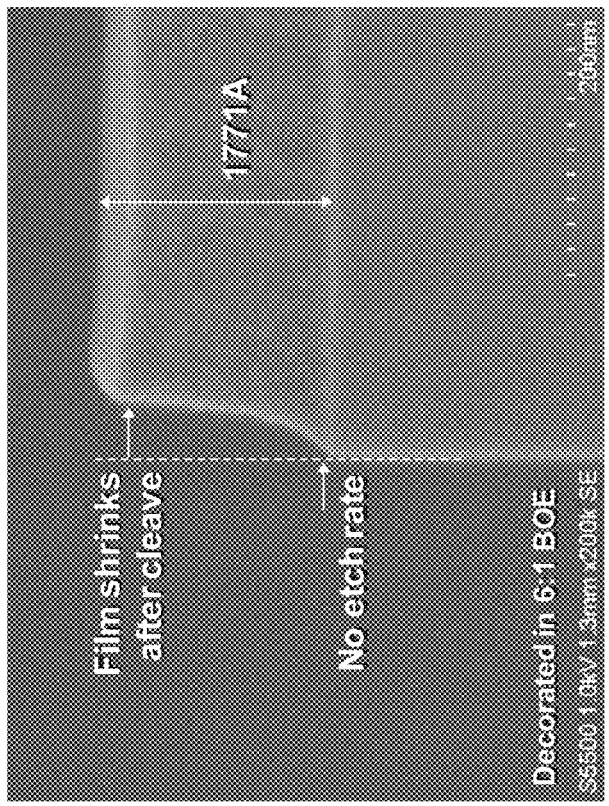

FIGS. 8A and 8B show images of a low-k flowable dielectric film before and after an $O_2$-based plasma treatment. FIG. 8A shows a carbon-containing low-k flowable oxide film decorated in 6:1 buffered oxide etch (BOE), and FIG. 8B after the low flowable oxide film after $O_2$-based based treatment decorated in 6:1 BOE. A 60 second wet etch in BOE shows a significant amount of film etched from the top and side surfaces of the film. As shown, exposure to an oxidizing plasma increases the WER.

Figure 8C:
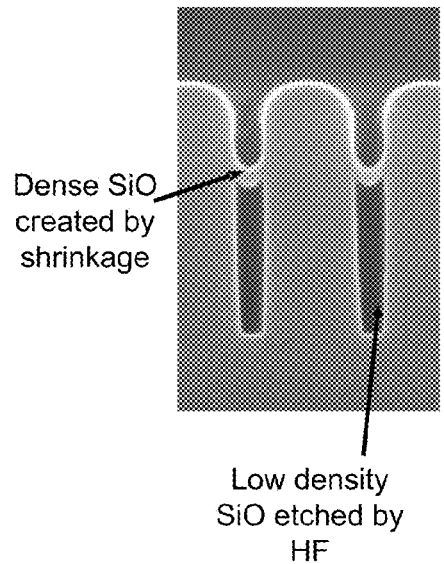
FIGS. 8C and 8D show images comparing wet etch of a flowable dielectric film after exposure to a remote oxidizing cure to wet etch of a flowable dielectric film after exposure to a nitridizing high density plasma.
Figure 8D:
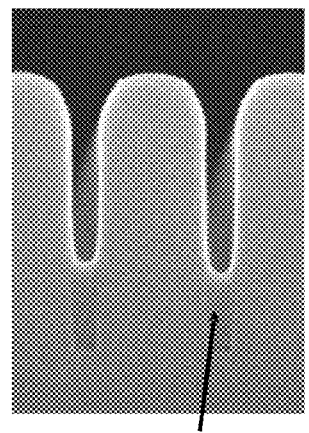

As indicated above, decreasing the WER can include exposure to a nitrogen-containing plasma. FIGS. 8C and 8D show images comparing wet etch of a flowable dielectric film after exposure to a remote oxidizing cure to wet etch of a flowable dielectric film after exposure to a nitridizing high density plasma (HDP). As shown, the $N_2$ plasma treated film has a lower etch rate than the $O_2$ plasma treated film. Both films were deposited from TES/$H_2$O.

Integration

In certain embodiments, a flowable dielectric film can be formed (e.g., in block 101) and/or treated (e.g., in block 105) to target a certain WER for a process involving exposure to a wet etchant in subsequent integration (e.g., in blocks 103 and 107). According to various embodiments, the WER can be tuned such that film is etch-resistant or easily etched depending on the particular integration process. In some embodiments, the WER is tuned such that the etch selectivity of the flowable dielectric film is tuned relative to one or more other films on the substrate.

Wet etchants that the flowable dielectric film can be exposed to, for example, in block 103 and/or 107 can include one or more of dilute HF in $H_2O$ (e.g., 1000:1 $H_2O$:HF, 100:1 $H_2O$:HF or 50:1 $H_2O$:HF), buffered oxide etch (BOE), SC1 $NH_4OH$:$H_2O_2$:$H_2O$ solution, RCA $NH_4OH$:$H_2O_2$:$H_2O$ solution, SPM $H_2SO_4$:$H_2O_2$:$H_2O$ solution, REZI-38 etchant, phosphoric acid solutions, and tetramethylammonium hydroxide (TMAH). According to various embodiments, the flowable dielectric film be etch resistant to a particular etchant at one stage of an integration process and etched by that etchant or another etchant at another stage of the integration process.

In one example, a flowable Si—H rich film can be deposited and densified without chemical conversion. The film has a relatively low WER and various integration processes including, for example, exposing the film to wet etchant, can be performed. After the integration processes, the WER can be increased by chemically converted the film by oxidation.

Figure 9:
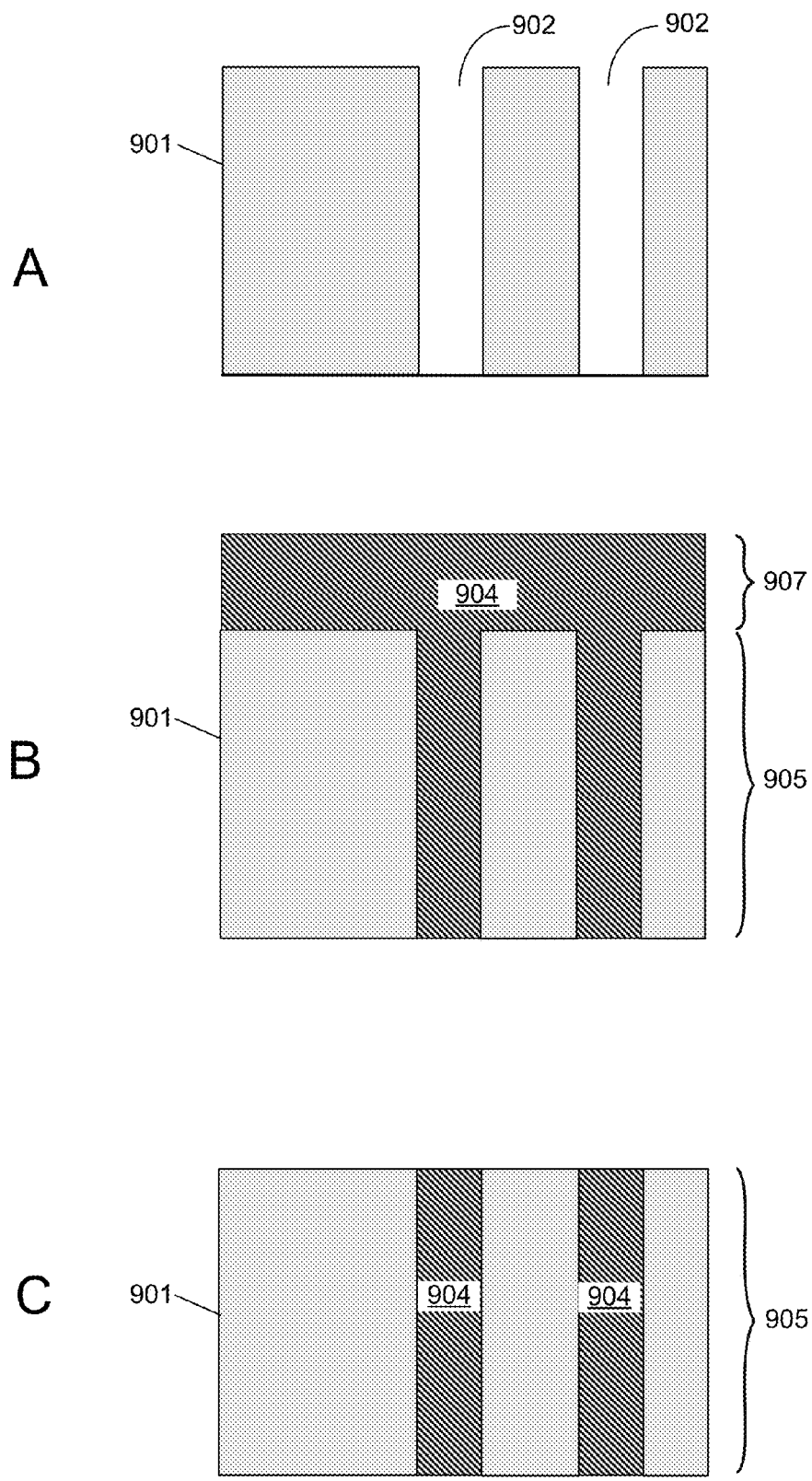
FIGS. 9 and 10A provide examples of integration schemes including flowable dielectric films having tunable WER's.
Figure 10A:
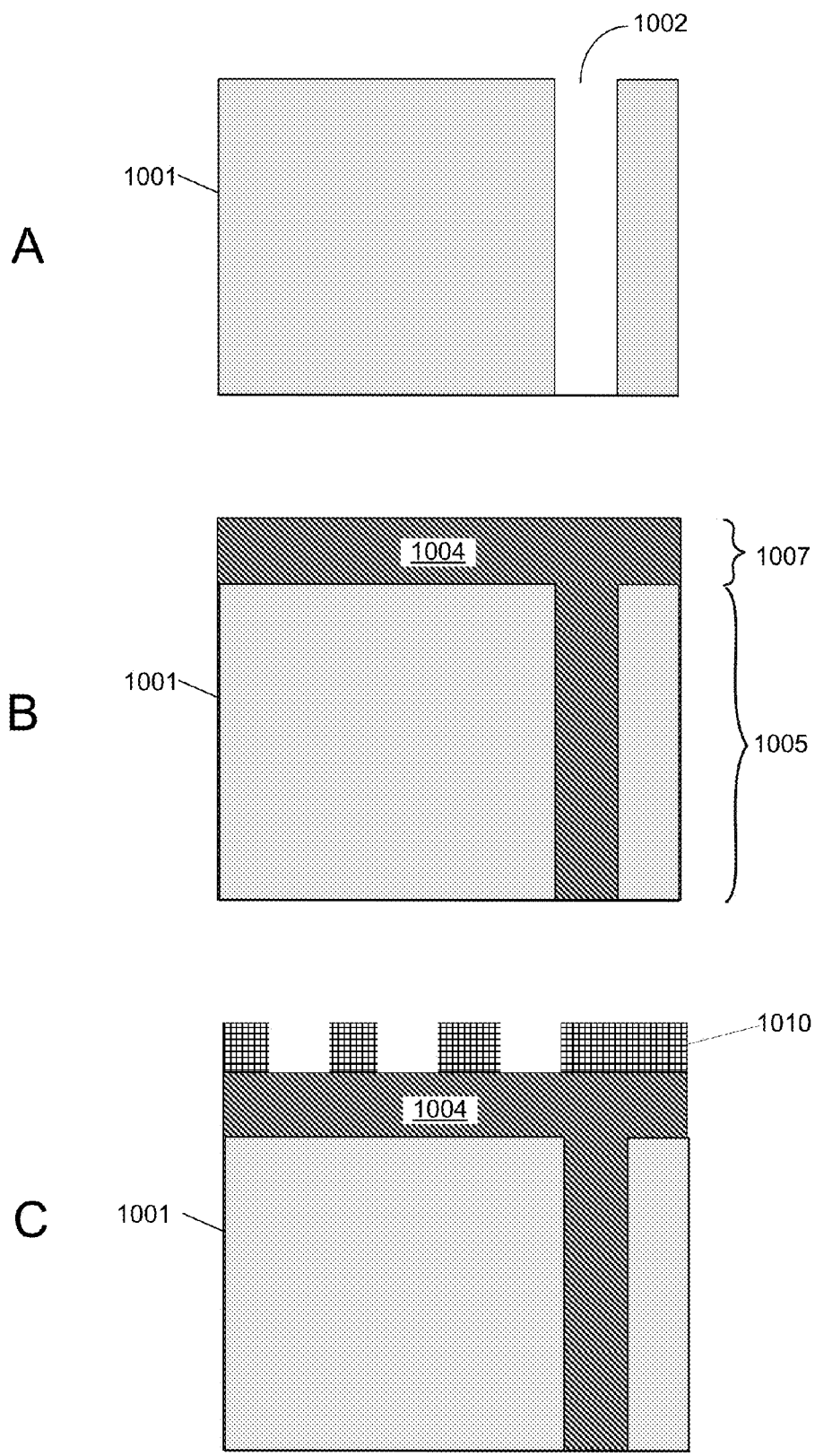
Figure 10B:
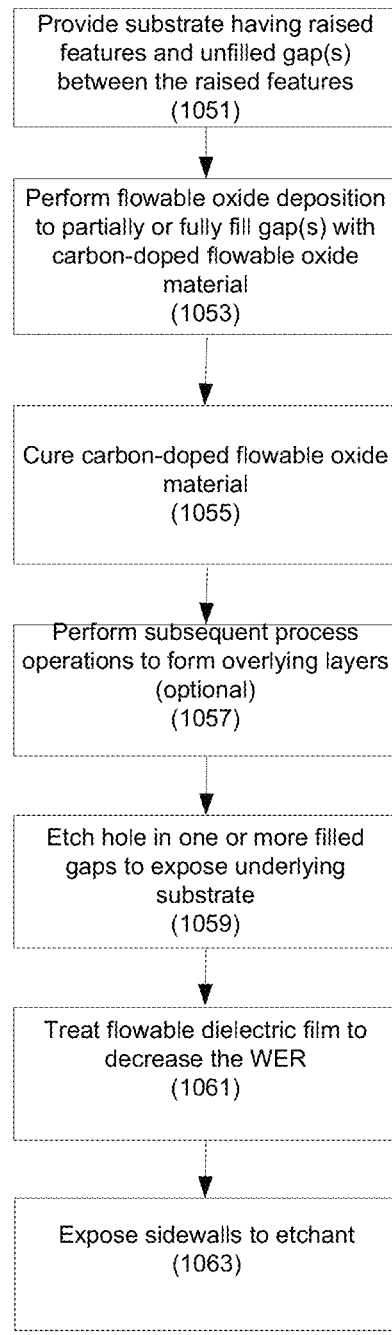
FIG. 10B is a flow diagram showing certain operations in a method in which the WER is decreased during integration.

FIGS. 9-10B provide examples of integration schemes including flowable dielectric films having tunable WER's. First, FIG. 9 shows cross-sectional schematic depictions of a structure at various stages in an integration scheme including a masking operation. At stage A, a structure 901 including two high aspect ratio gaps 902 is shown. Structure 901 can include one or more materials include metals, nitrides, oxides, carbides, oxynitrides, oxycarbides, silicides, as well as bare silicon or other semiconductor material. Particular examples include SiN, $SiO_2$, SiC, SiON, NiSi, polysilicon and any other silicon-containing material. Further examples include copper, tantalum, tantalum nitride, titanium, titanium nitride, ruthenium and cobalt.

At stage B, a tunable flowable dielectric film 904 is formed. Film 904 includes gap fill 905 and an overburden layer 907. In the example depicted, the tunable flowable dielectric film 904 has a low WER. Stage B can correspond to block 101 of FIG. 1, for example. At stage C, the structure 901 undergoes CMP or other planarizing operation to remove the overburden layer 907. At stage D, a mask overlies portions of the structure 901 including the flowable dielectric film 904. Application-specific operations are performed to pattern and form material 908 in structure 901. These operations can include lithography, implant, thin film deposition, CMP, wet etch clean and the like. Stages C and D can correspond to block 103 of FIG. 1, for example. At stage E, the mask is removed and the tunable flowable dielectric film is treated to increase the WER, forming a tunable flowable dielectric film 914 having a very high WER. Stage E can correspond to block 105 of FIG. 1, for example. At stage F, the tunable flowable dielectric film 914 is removed by a wet etch or dry etch process to expose the original pattern including high aspect ratio gaps 902. Structure 901 now includes material 908. Stage F can correspond to block 107 of FIG. 1, for example.

FIG. 10A shows cross-sectional schematic depictions of a structure at various stages in an integration scheme including subtractive patterning. At stage A, a structure 1001 including high aspect ratio gap 1002 is shown. At stage B, a tunable flowable dielectric film 1004 is formed. Film 1004 includes gap fill 1005 and an overburden layer 1007. In the example depicted, the tunable flowable dielectric film 1004 has a low WER. Stage B can correspond to block 101 of FIG. 1, for example.

At stage C, lithography is used to create patterned mask 1010 over the tunable flowable dielectric film 1004. At stage D, the unmasked portions of the tunable flowable dielectric film are treated to increase the WER, forming high WER film 1014. Stages C and D can correspond to blocks 103 and 105 of FIG. 1, for example. The high WER film 1014 is removed at operation E by a wet or dry etch process. At stage F, application-specific structures 1008 are formed. Forming structures 1008 can include implant, thin film deposition, CMP, wet etch clean and the like. Stages E and F can correspond to block 107 of FIG. 1, for example. Once structures 1008 are formed, the tunable flowable dielectric film can be tuned to form high WER film 1014 in a stage G. The film can then be removed in a stage H by wet or dry etch. Stages G and H can correspond to blocks 105 and 107 of FIG. 1, for example.

While FIGS. 9 and 10A provide examples of integration schemes in which WER is increased, FIG. 10B is a flow diagram illustrating an example of a process in which the WER can be decreased during integration. A method begins by providing a substrate having one or more raised features and unfilled gaps between those features (1051). An example is a gap between two gate structures at the device level of a partially fabricated integrated circuit. The method continues by performing a flowable dielectric deposition operation to partially or wholly fill the gaps with a carbon-doped flowable oxide material (1053). A carbon-doped dielectric precursor can be used, either alone or with one or more doped or undoped dielectric precursors.

Next, the as-deposited flowable oxide material is exposed to a post-deposition cure operation (1055). The cure may serve to densify, change the chemical composition of, or change the physical properties of the flowable oxide material. In some cases, an oxidizing plasma may be used to reduce the carbon concentration in the film by reacting with and removing carbon species. Blocks 1053 and 1055 together can correspond to block 101 of FIG. 1, for example.

After the cure, one or more additional layers are optionally formed on the substrate (1057). For example, in certain embodiments, another dielectric layer is formed over the filled gap, e.g., by a flowable oxide or TEOS oxide deposition process. This may or may not take place after various other operations, such as formation of structures, CMP, etc. In a subsequent operation, a hole, e.g., a contact hole, is formed in the gap fill material to expose a surface of the underlying substrate. (Block 1059). The remaining gap fill material forms at least part of the sidewalls of the hole. Blocks 1057 and 1059 can correspond to block 103 of FIG. 1, for example. A treatment operation is then performed to decrease the WER of the remaining gap fill material (1061). The structure is then exposed to a wet or dry etchant (1063).

Apparatus

The methods of the present invention may be performed on a wide-range of reaction chambers. The methods may be implemented on any chamber equipped for deposition of dielectric film, including HDP-CVD reactors, PECVD reactors, sub-atmospheric CVD reactors, any chamber equipped for CVD reactions, and chambers used for PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate. Examples of suitable reactors are the Sequel™ reactor, the Vector™, the Speed™ reactor, and the Gamma™ reactor all available from Novellus Systems of San Jose, Calif.

Figure 11:
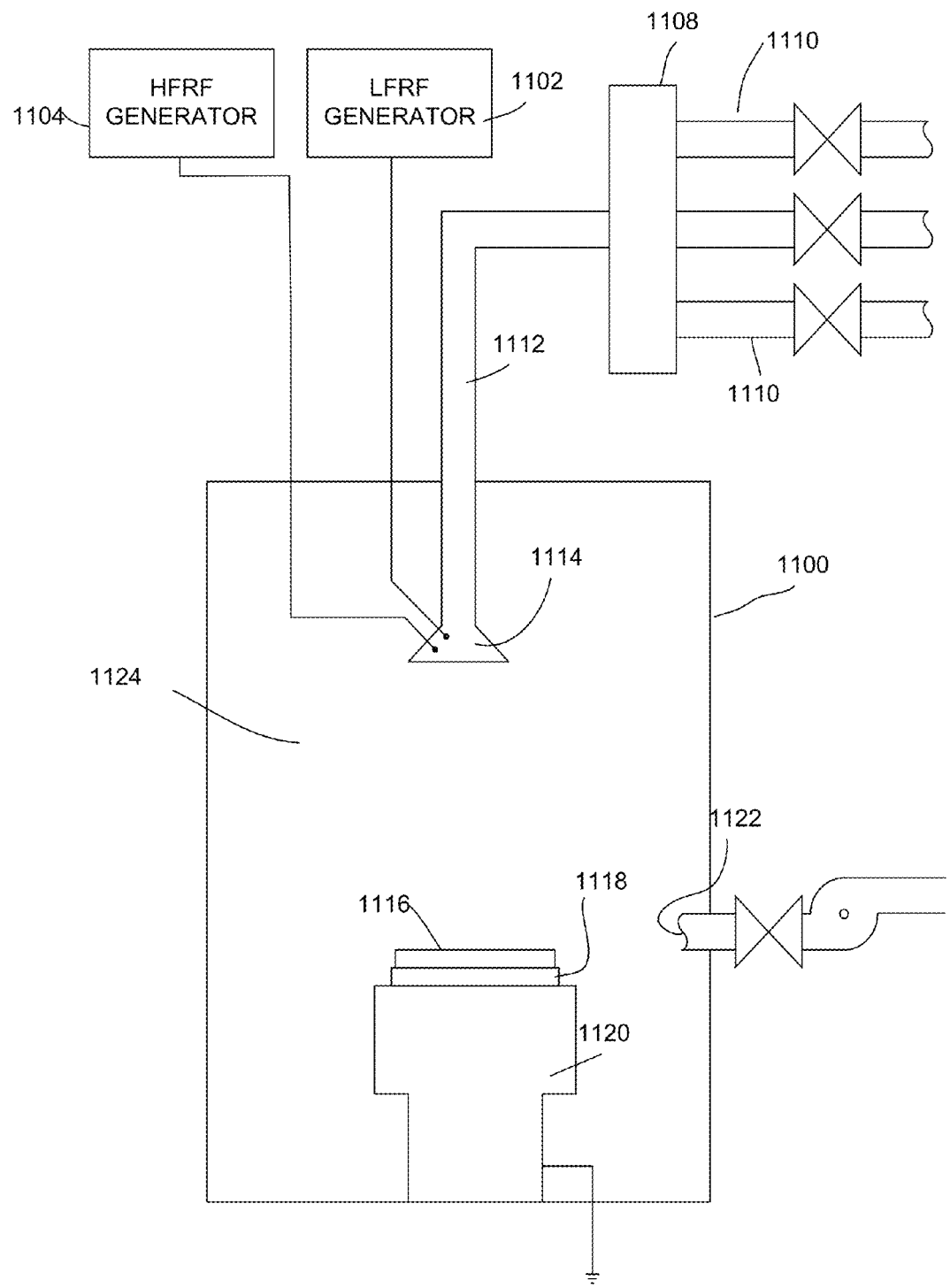
FIG. 11 is a schematic diagram illustrating a deposition and/or treatment chamber suitable for practicing various embodiments.

FIG. 11 shows an example of a reactor that may be used in accordance with certain embodiments of the invention, as a deposition chamber, a treatment and deposition chamber, or as an independent cure module. The reactor shown in FIG. 11 is suitable for both the dark (non-plasma) or plasma-enhanced deposition and as well as cure, for example, by capacitively-coupled plasma anneal. As shown, a reactor 1100 includes a process chamber 1124, which encloses other components of the reactor and serves to contain the plasma generated by a capacitor type system including a showerhead 1114 working in conjunction with a grounded heater block

1120. A low-frequency RF generator 1102 and a high-frequency RF generator 1104 are connected to showerhead 1114. In alternate embodiments, RF is applied to the pedestal with the showerhead grounded. In some embodiments, HF only power can be applied to either the showerhead or the pedestal. In some embodiments, HF can be applied to one of the showerhead or pedestal with LF applied to the other. Various other configurations may be employed. The power and frequency are sufficient to generate a plasma from the process gas, for example 50W to 5 kW total energy. In the implementation of the present invention, the generators are not used during dark deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 1118 supports a substrate 1116. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 1112. Multiple source gas lines 1110 are connected to manifold 1108. The gases may be premixed or not. The temperature of the mixing bowl/manifold lines should be maintained at levels above the reaction temperature. Temperatures at or above about 8° C. at pressures at or less than about 100 Torr usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 1100 via an outlet 1122. A vacuum pump 1126 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 12:
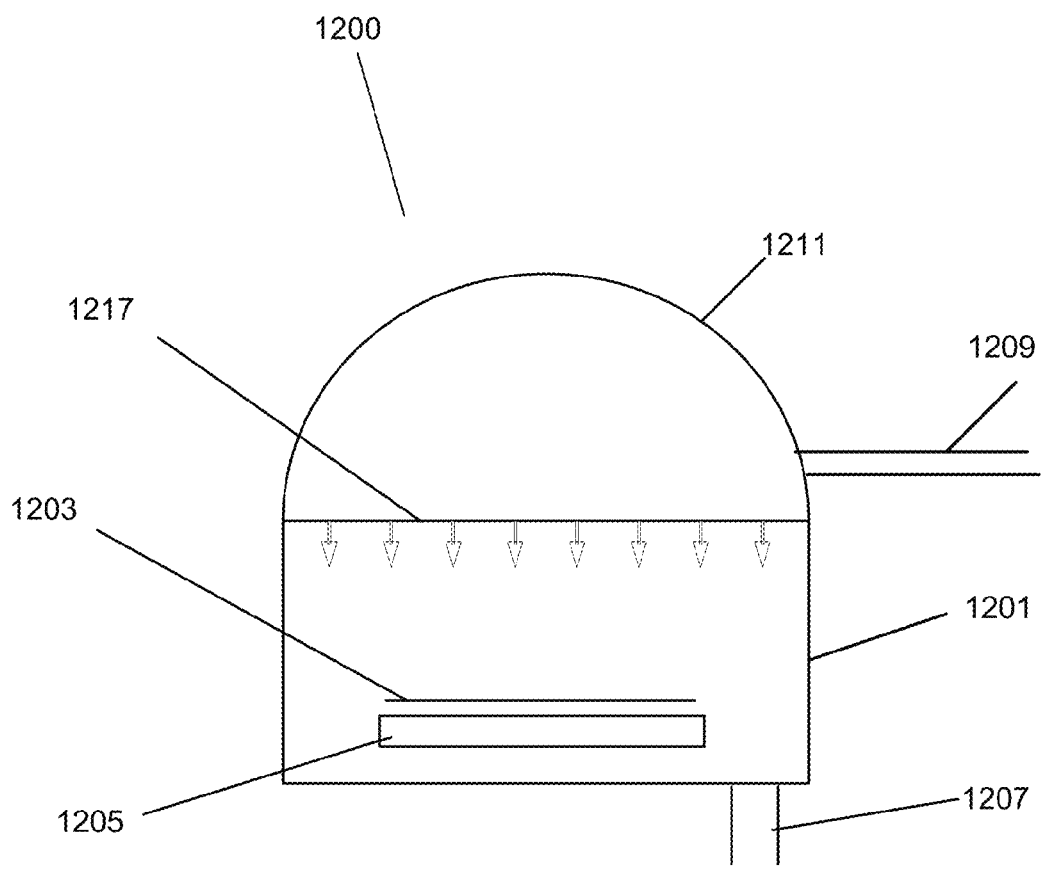
FIG. 12 is simplified illustration of a cure module suitable for practicing various embodiments.

FIG. 12 illustrates a simplified embodiment of a cure module according to certain embodiments. Apparatus 1200 has a plasma producing portion 1211 and an exposure chamber 1201 separated by a showerhead assembly or faceplate 1217. Inside exposure chamber 1201, a platen (or stage) 1205 provides a wafer support. Platen 1205 is fitted with a heating/cooling element. In some embodiments, platen 1205 is also configured for applying a bias to wafer 1203. Low pressure is attained in exposure chamber 1201 via vacuum pump via conduit 1207. Sources of gaseous treatment gases provide a flow of gas via inlet 1209 into plasma producing portion 1211 of the apparatus. Plasma producing portion 1211 may surrounded by induction coils (not shown). During operation, gas mixtures are introduced into plasma producing portion 1211, the induction coils are energized and a plasma is generated in plasma producing portion 1211. Showerhead assembly 1217 may have an applied voltage and terminates the flow of some ions and allows the flow of neutral species into exposure chamber 1201.

Figure 13:
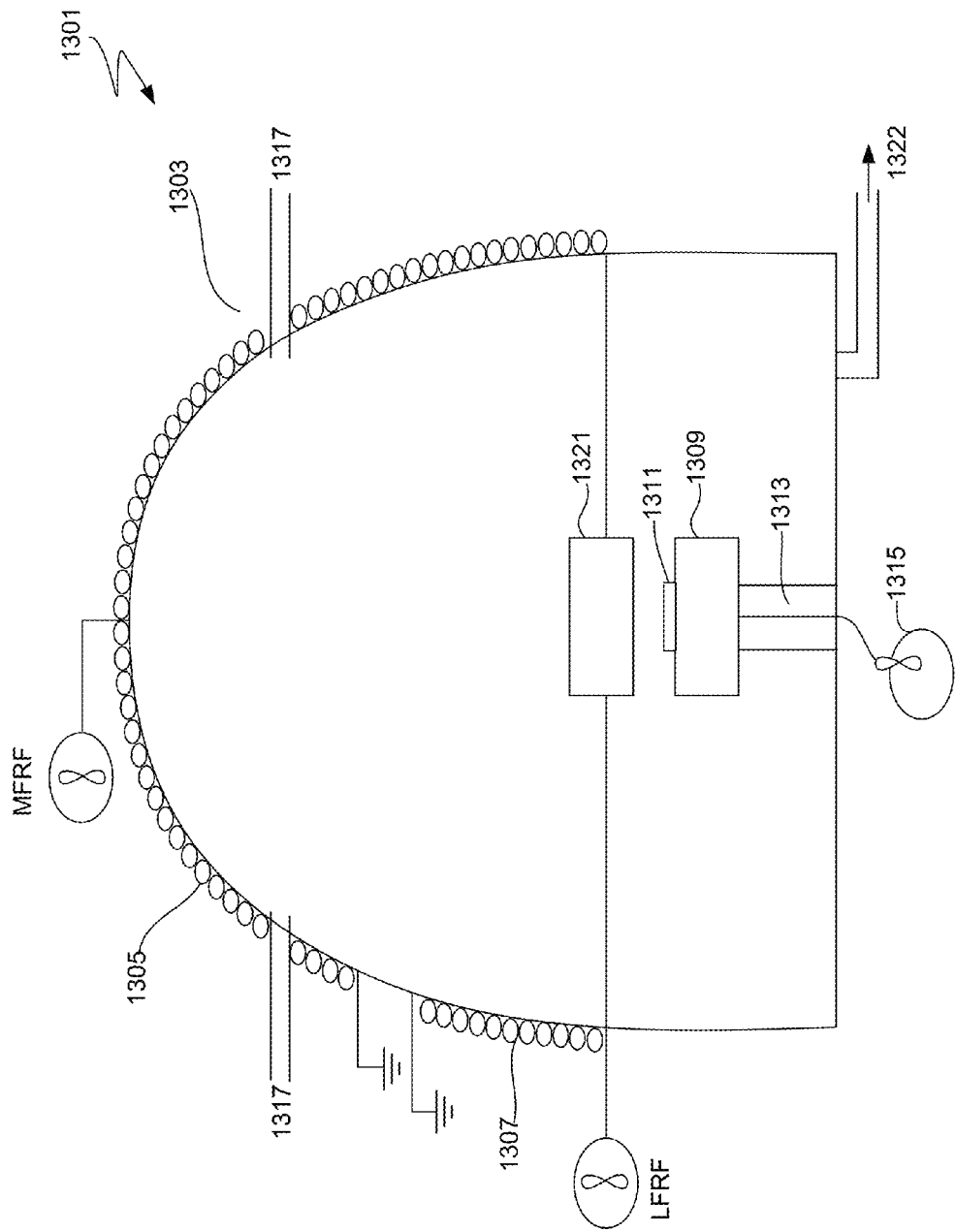
FIG. 13 is simplified illustration of a HDP-CVD module suitable for practicing various embodiments.

FIG. 13 is a simplified illustration of various components of a HDP-CVD apparatus that may be used for pre- and/or post-deposition treatment or cures according to various embodiments. As shown, a reactor 1301 includes a process chamber 1303 which encloses other components of the reactor and serves to contain the plasma. In one example, the process chamber walls are made from aluminum, aluminum oxide, and/or other suitable material. The embodiment shown in FIG. 13 has two plasma sources: top RF coil 1305 and side RF coil 1307. Top RF coil 1305 is a medium frequency or MFRF coil and side RF coil 1307 is a low frequency or LFRF coil. In the embodiment shown in FIG. 13, MFRF frequency may be from 430-470 kHz and LFRF frequency from 340-370 kHz. However, apparatuses having single sources and/or non-RF plasma sources may be used.

Within the reactor, a wafer pedestal 1309 supports a substrate 1311. A heat transfer subsystem including a line 1313 for supplying heat transfer fluid controls the temperature of substrate 1311. The wafer chuck and heat transfer fluid system can facilitate maintaining the appropriate wafer temperatures.

A high frequency RF of HFRF source 1315 serves to electrically bias substrate 1311 and draw charged precursor species onto the substrate for the pre-treatment or cure operation. Electrical energy from source 1315 is coupled to substrate 1311 via an electrode or capacitive coupling, for example. Note that the bias applied to the substrate need not be an RF bias. Other frequencies and DC bias may be used as well.

The process gases are introduced via one or more inlets 1317. The gases may be premixed or not. The gas or gas mixtures may be introduced from a primary gas ring 1321, which may or may not direct the gases toward the substrate surface. Injectors may be connected to the primary gas ring 1321 to direct at least some of the gases or gas mixtures into the chamber and toward substrate. The injectors, gas rings or other mechanisms for directing process gas toward the wafer are not present in certain embodiments. Process gases exit chamber 1303 via an outlet 1322. A vacuum pump typically draws process gases out and maintains a suitably low pressure within the reactor. While the HDP chamber is described in the context of pre- and/or post-deposition treatment or cure, in certain embodiments, it may be used as a deposition reactor for deposition of a flowable film. For example, in a thermal (non-plasma) deposition, such a chamber may be used without striking a plasma.

In certain embodiments, a system controller is employed to control process parameters. The system controller typically includes one or more memory devices and one or more processors. The processor may include a CPU or computer, analog and/or digital input/output connections, stepper motor controller boards, etc. Typically there will be a user interface associated with system controller. The user interface may include a display screen, graphical software displays of the apparatus and/or process conditions, and user input devices such as pointing devices, keyboards, touch screens, microphones, etc. The system controller may be connected to any or all of the components of a tool; its placement and connectivity may vary based on the particular implementation.

In certain embodiments, the system controller controls the pressure in the processing chambers. The system controller may also control concentration of various process gases in the chamber by regulating valves, liquid delivery controllers and MFCs in the delivery system as well as flow restriction valves and the exhaust line. The system controller executes system control software including sets of instructions for controlling the timing, flow rates of gases and liquids, chamber pressure, substrate temperature, and other parameters of a particular process. Other computer programs stored on memory devices associated with the controller may be employed in some embodiments. In certain embodiments, the system controller controls the transfer of a substrate into and out of various components of the apparatuses.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

The disclosed methods and apparatuses may also be implemented in systems including lithography and/or patterning hardware for semiconductor fabrication. Further, the disclosed methods may be implemented in a process with lithography and/or patterning processes preceding or following the disclosed methods. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

The invention claimed is:

1. A method, comprising:
   forming a flowable dielectric film on a substrate, wherein the flowable dielectric film has a first wet etch rate;
   performing one or more integration processes on the substrate; and
   after performing the one or more integration processes, modifying the wet etch rate of the flowable dielectric film wherein the modified wet etch rate is higher than the first wet etch rate.

2. The method of claim 1, wherein the flowable dielectric film is a silicon oxide, a silicon nitride, a silicon oxynitride, silicon carbide, or a silicon oxycarbide film.

3. The method of claim 1, wherein the flowable dielectric film is a carbon-doped oxide, a boron-doped oxide, a phosphorous-doped oxide, or a nitrogen-doped oxide.

4. The method of claim 1, wherein modifying the first wet etch rate comprises exposing the flowable dielectric film to ultraviolet radiation.

5. The method of claim 1, further comprising treating the flowable dielectric film by exposing the flowable dielectric film to species from an in situ or remote plasma and wherein treating the flowable film chemically and/or physically modifies the flowable dielectric film.

6. The method of claim 1, wherein the one or more integration processes include at least one of an etch process, a deposition process, a planarization process, a photoresist strip process, a wet clean process, and a lithographic patterning process.

7. The method of claim 1, wherein forming a flowable dielectric film on the substrate comprises depositing a flowable dielectric film and densifying the deposited film.

8. The method of claim 1, comprising physically densifying the flowable film prior to performing the one or more integration process and chemically modifying the flowable film after performing the one or more integration processes.

9. A method comprising:
   depositing a flowable dielectric film on a substrate; and
   densifying the flowable dielectric film, wherein the densified flowable dielectric film has a first wet etch rate, wherein said first wet etch rate is tunable such that it can be changed by a factor of at least 10, wherein the first wet etch rate is about zero in one or more of dilute HF in $H_2O$, buffered oxide etch (BOE), $NH_4OH:H_2O_2:H_2O$ solution, $H_2SO_4:H_2O_2:H_2O$ solution, phosphoric acid solutions, and tetramethylammonium hydroxide (TMAH).

10. The method of claim 9, wherein the carbon concentration of the densified flowable dielectric film is less than about 5% atomic.

11. The method of claim 9, wherein the carbon concentration of the densified flowable dielectric film is between 5 and 35% atomic.

12. The method of claim 9, wherein depositing a flowable dielectric film on a substrate comprises exposing the substrate to a carbon-doped precursor.

13. The method of claim 9, wherein depositing the flowable dielectric film on the substrate comprises reacting a non-hydroxyl-forming oxidant with a silicon-containing precursor.

14. The method of claim 13, wherein depositing the silicon-containing precursor is an alkoxy compound.

15. A method comprising:
   after performing one or more integration operations including at least one of a lithography process, an ion implantation process, a photoresist strip process, a wet etch process, and a dry etch process, on a substrate including a flowable dielectric film, treating the flowable dielectric film to modify a wet etch rate of the flowable dielectric film, wherein treating the flowable film increases the wet etch rate such that the modified wet etch rate is higher than the wet etch rate of the film prior to treatment.

16. The method of claim 15, wherein treating the flowable dielectric film comprises removing at least one of carbon, nitrogen or hydrogen from the flowable dielectric film.

17. The method of claim 15, wherein treating the flowable dielectric film comprises adding at least one of carbon, nitrogen, or hydrogen to the flowable dielectric film.

18. The method of claim 15, wherein treating the flowable dielectric film comprises exposing it to reactive oxygen species from a direct or remote plasma.

19. The method of claim 15, wherein treating the flowable dielectric film comprises exposing it to reactive hydrogen species from a direct or remote plasma.

20. The method of claim 15, wherein treating the flowable dielectric film comprises exposing it to reactive nitrogen species from a direct or remote plasma.

21. The method of claim 15, wherein treating the flowable dielectric film comprises exposing it to ultraviolet radiation.

22. The method of claim 15, wherein the integration operations include a lithography process.

\* \* \* \* \*